(12) United States Patent
Fuji

(10) Patent No.: US 11,710,705 B2
(45) Date of Patent: Jul. 25, 2023

(54) SEMICONDUCTOR DEVICE AND METHOD FOR MANUFACTURING SEMICONDUCTOR DEVICE

(71) Applicant: ROHM CO., LTD., Kyoto (JP)

(72) Inventor: Kazunori Fuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 17 days.

(21) Appl. No.: 17/278,801

(22) PCT Filed: Sep. 30, 2019

(86) PCT No.: PCT/JP2019/038445
§ 371 (c)(1),
(2) Date: Mar. 23, 2021

(87) PCT Pub. No.: WO2020/075549
PCT Pub. Date: Apr. 16, 2020

(65) Prior Publication Data
US 2022/0037260 A1 Feb. 3, 2022

(30) Foreign Application Priority Data
Oct. 9, 2018 (JP) .............................. JP2018-190763

(51) Int. Cl.
*H01L 23/04* (2006.01)
*H01L 23/538* (2006.01)
(Continued)

(52) U.S. Cl.
CPC ...... *H01L 23/5389* (2013.01); *H01L 23/3107* (2013.01); *H01L 24/45* (2013.01);
(Continued)

(58) Field of Classification Search
CPC ............. H01L 23/5389; H01L 23/3107; H01L 24/45; H01L 24/97; H01L 2224/73265; H01L 2224/97; H01L 2924/18301
(Continued)

(56) References Cited

U.S. PATENT DOCUMENTS

2006/0118932 A1 6/2006 Nanba et al.
2010/0206632 A1 8/2010 Ikeda et al.
(Continued)

FOREIGN PATENT DOCUMENTS

JP 2003-264266 A 9/2003
JP 2006-165518 A 6/2006
(Continued)

OTHER PUBLICATIONS

International Search Report issued in PCT/JP2019/038445, dated Dec. 3, 2019 (2 pages).
(Continued)

*Primary Examiner* — Kimberly N Rizkallah
*Assistant Examiner* — Dilinh P Nguyen
(74) *Attorney, Agent, or Firm* — Hamre, Schumann, Mueller & Larson, P.C.

(57) ABSTRACT

A semiconductor device A1 disclosed includes: a semiconductor element 10 having an element obverse face and element reverse face that face oppositely in a thickness direction z, with an obverse-face electrode 11 (first electrode 111) and a reverse-face electrode 12 respectively formed on the element obverse face and the element reverse face; a conductive member 22A opposing the element reverse face and conductively bonded to the reverse-face electrode 12; a conductive member 22B spaced apart from the conductive member 22A and electrically connected to the obverse-face electrode 11; and a lead member 51 having a lead obverse face 51a facing in the same direction as the element obverse
(Continued)

face and connecting the obverse-face electrode 11 and the conductive member 22B. The lead member 51, bonded to the obverse-face electrode 11 via a lead bonding layer 321, includes a protrusion 521 protruding in the thickness direction z from the lead obverse face 51a. The protrusion 521 overlaps with the obverse-face electrode 11 as viewed in the thickness direction z. This configuration suppresses deformation of the connecting member to be pressed during sintering treatment.

23 Claims, 26 Drawing Sheets

(51) Int. Cl.
  *H01L 23/31* (2006.01)
  *H01L 23/00* (2006.01)
(52) U.S. Cl.
  CPC .... *H01L 24/97* (2013.01); *H01L 2224/48247* (2013.01); *H01L 2224/73265* (2013.01); *H01L 2224/97* (2013.01); *H01L 2924/18301* (2013.01)

(58) Field of Classification Search
  USPC .......................................................... 257/698
  See application file for complete search history.

(56) References Cited

U.S. PATENT DOCUMENTS

| 2018/0108582 A1* | 4/2018 | Yanagida | ............ H01L 21/4878 |
| 2018/0240778 A1* | 8/2018 | Liu | ..................... H01L 23/3142 |

FOREIGN PATENT DOCUMENTS

| JP | 2016-111083 A | 6/2016 |
| JP | 2016-139635 A | 8/2016 |
| JP | 2017-34167 A | 2/2017 |
| JP | 2018-504788 A | 2/2018 |
| JP | 2018-116995 A | 7/2018 |

OTHER PUBLICATIONS

Office Action issued in corresponding Japanse Patent Application No. 2020-550411, dated Jan. 31, 2023, 4 pages w/translation.
Office Action received in the corresponding Chinese Patent application, dated Apr. 28, 2023, and machine translation (14 pages).

* cited by examiner

SEMICONDUCTOR DEVICE AND METHOD FOR MANUFACTURING SEMICONDUCTOR DEVICE

TECHNICAL FIELD

The present disclosure relates to a semiconductor device and a method for manufacturing the same.

BACKGROUND ART

Lead solder has conventionally been used as a bonding material for bonding a semiconductor element to a conductor for reasons such as ease of use. However, from the viewpoint of protecting the human body and reducing the environmental burden, lead solder has been replaced with lead-free bonding materials. For example, Patent Document 1 discloses a semiconductor device that uses sintered metal as a bonding material. The semiconductor device described in Patent Document 1 includes a die, a lead frame, a clip, and sintered silver. The die is mounted to the lead frame. The lead frame includes a first portion and a second portion that are spaced apart from each other. The die is bonded to the first portion of the lead frame. The clip is a plate-shaped conductor. The clip is a connecting member that electrically connects the die and the second portion of the lead frame to each other. The clip includes a first bonding portion that is bonded to the die, a second bonding portion that is bonded to the second portion of the lead frame, and a connecting portion that connects these bonding portions to each other.

PRIOR ART DOCUMENT

Patent Document

Patent Document 1: JP-A-2018-504788

SUMMARY OF THE INVENTION

Problem to be Solved by the Invention

In a conventional semiconductor device, when the clip and the die are bonded, a sintering metallic material (sinterable silver film) formed between the clip and the die sintered, which results in the sintering metallic material becoming sintered metal (sintered silver), and the clip and the die are thus bonded to each other. In this sintering treatment, the clip is pressed by a pressing member to press the sintering metallic material using the pressing force of the pressing member. The sintering metallic material is subjected to heat treatment in a pressed stated. In the conventional semiconductor device, since a portion below the connecting portion is hollow, the connecting portion of the clip may be bent due to the aforementioned pressing force when pressed during the above sintering treatment. Such deformation may cause a decrease in the strength of the clip, a decrease in conductivity, unintended contact, or the like.

The present disclosure has been made in view of the foregoing problem, and aims to provide a semiconductor device and a method for manufacturing the same that make it possible to suppress deformation of the connecting member due to being pressed during the sintering treatment.

Means for Solving the Problem

A semiconductor device provided according to a first aspect of the present disclosure is a semiconductor device including: a semiconductor element having an element obverse face and an element reverse face that face toward opposite sides in a first direction, an obverse-face electrode and a reverse-face electrode being formed respectively on the element obverse face and the element reverse face; a first conductor opposing the element reverse face, the reverse-face electrode being conductively bonded to the first conductor; a second conductor arranged spaced apart from the first conductor, the second conductor being electrically connected to the obverse-face electrode; and a connecting member having a connecting member obverse face facing in the same direction as the element obverse face, the connecting member connecting the obverse-face electrode and the second conductor to each other, wherein the connecting member includes a first protrusion protruding in the first direction from the connecting member obverse face, and is bonded to the obverse-face electrode via a first bonding layer, and the first protrusion overlaps with the obverse-face electrode as viewed in the first direction.

A method for manufacturing a semiconductor device provided according to a second aspect of the present disclosure is a method for manufacturing a semiconductor device having: a semiconductor element having an element obverse face and an element reverse face that face toward opposite sides in a first direction; a first conductor and a second conductor arranged spaced apart from each other, and a connecting member having a connecting member obverse face facing toward one side in the first direction and including a first protrusion protruding in the first direction from the connecting member obverse face, the method including: a connecting member preparation step of preparing the connecting member; a mounting step of mounting the semiconductor element to the first conductor; a sintering metallic material forming step of forming a sintering metallic material on the element obverse face; a connecting step of placing a portion of the connecting member on the sintering metallic material such that the connecting member obverse face is in an orientation facing in the same direction as the element obverse face and such that the sintering metallic material and the first protrusion overlap with each other as viewed in the first direction; and a pressure heating step of pressing, using a pressing member, the connecting member from a side on which the first protrusion is formed, and heating the sintering metallic material to make the sintering metallic material into a sintered metal.

Advantages of the Invention

According to the semiconductor device and the method for manufacturing the same of the present disclosure, deformation of the connecting member due to being pressed during the sintering treatment can be suppressed.

MODE FOR CARRYING OUT THE INVENTION

Figure 1:
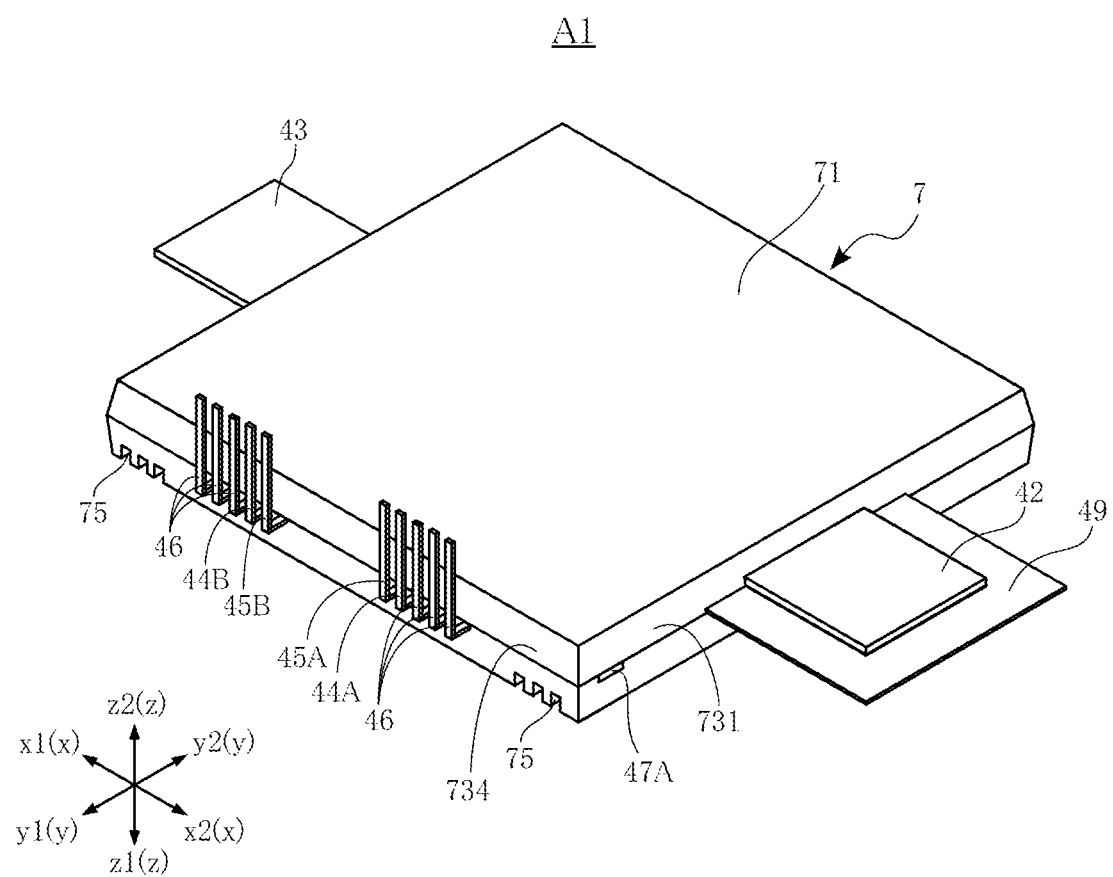
FIG. 1 is a perspective view showing a semiconductor device according to a first embodiment.

A semiconductor device and a method for manufacturing a semiconductor device of the present disclosure will be hereinafter described with reference to the drawings.

FIGS. 1 to 14 show a semiconductor device according to the first embodiment of the present disclosure. A semiconductor device A1 of the first embodiment includes a plurality of semiconductor elements 10, a support substrate 20, a plurality of conductive bonding layers 3, input terminals 41 and 42, an output terminal 43, a pair of gate terminals 44A and 44B, a pair of detection terminals 45A and 45B, a plurality of dummy terminals 46, a pair of side terminals 47A and 47B, an insulating member 49, a plurality of lead members 51, a plurality of wire members 6, and a sealing resin 7. Note that the input terminals 41 and 42, the output terminal 43, the pair of gate terminals 44A and 44B, the pair of detection terminals 45A and 45B, the plurality of dummy terminals 46, and the pair of side terminals 47A and 47B may collectively be referred to as terminals 40.

Figure 2:
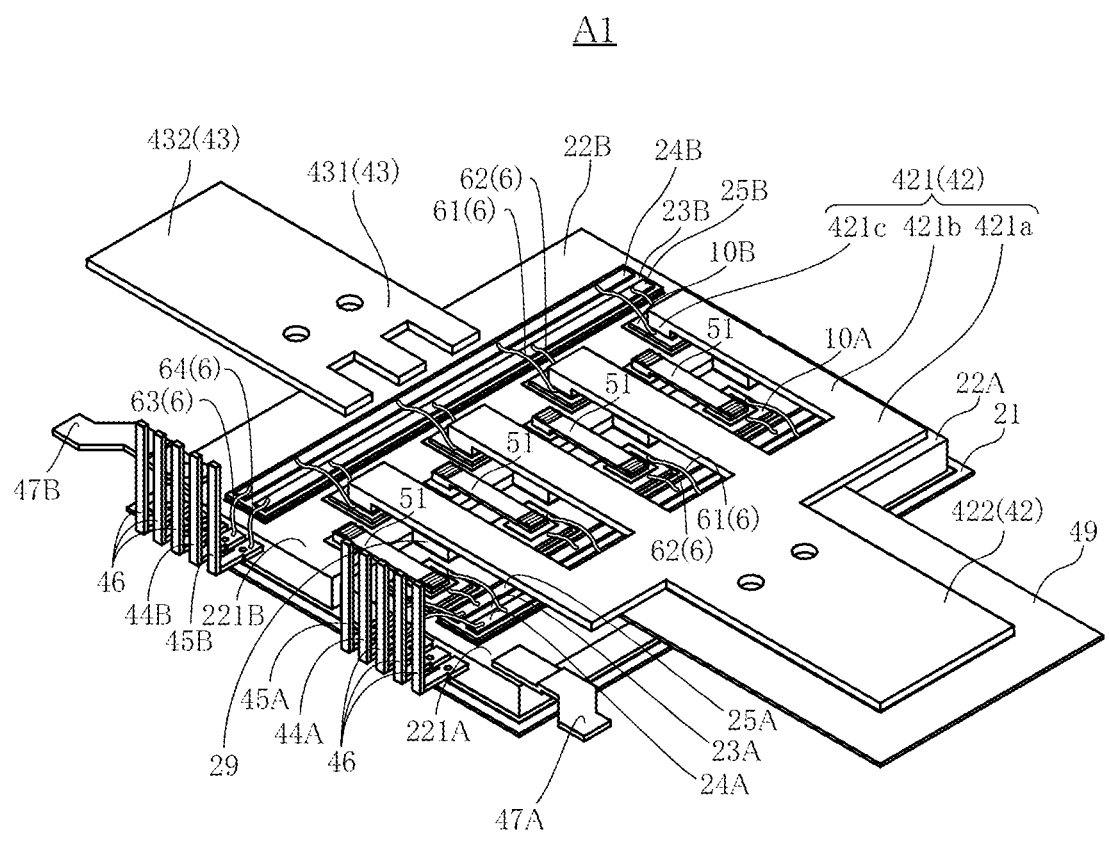
FIG. 2 is the perspective view shown in FIG. 1 from which a sealing resin is omitted.
Figure 2:
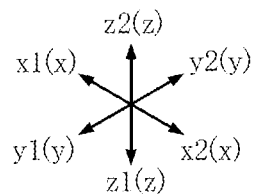
Figure 3:
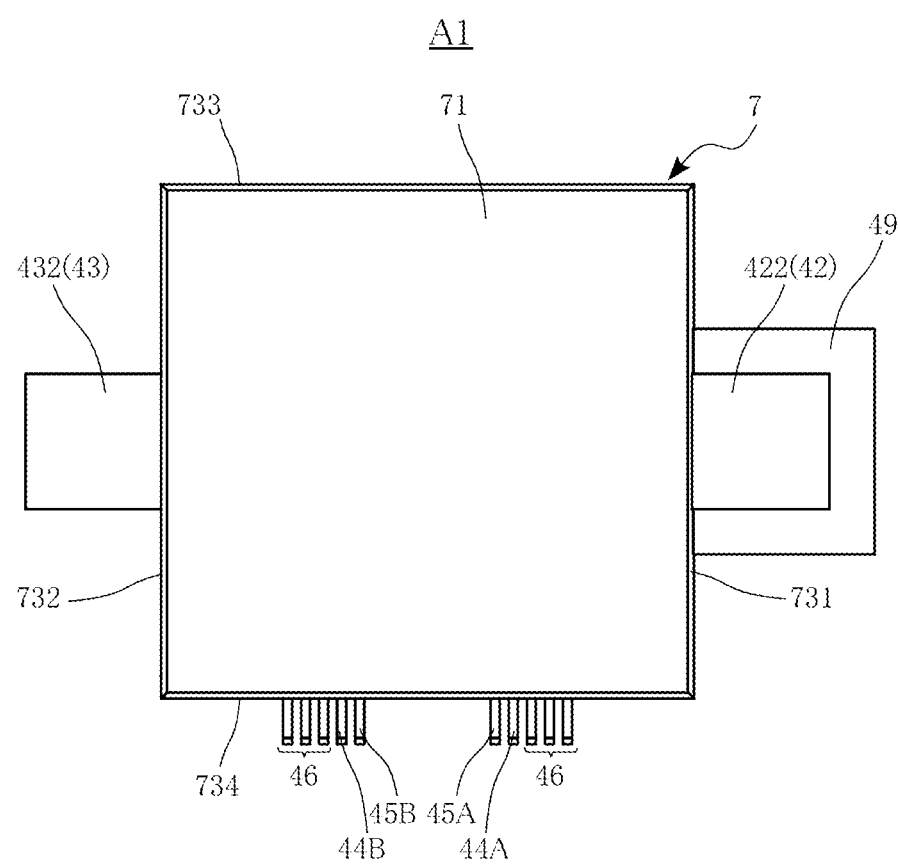
FIG. 3 is a plan view showing the semiconductor device according to the first embodiment.
Figure 3:
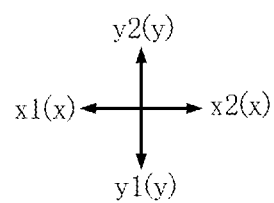
Figure 4:
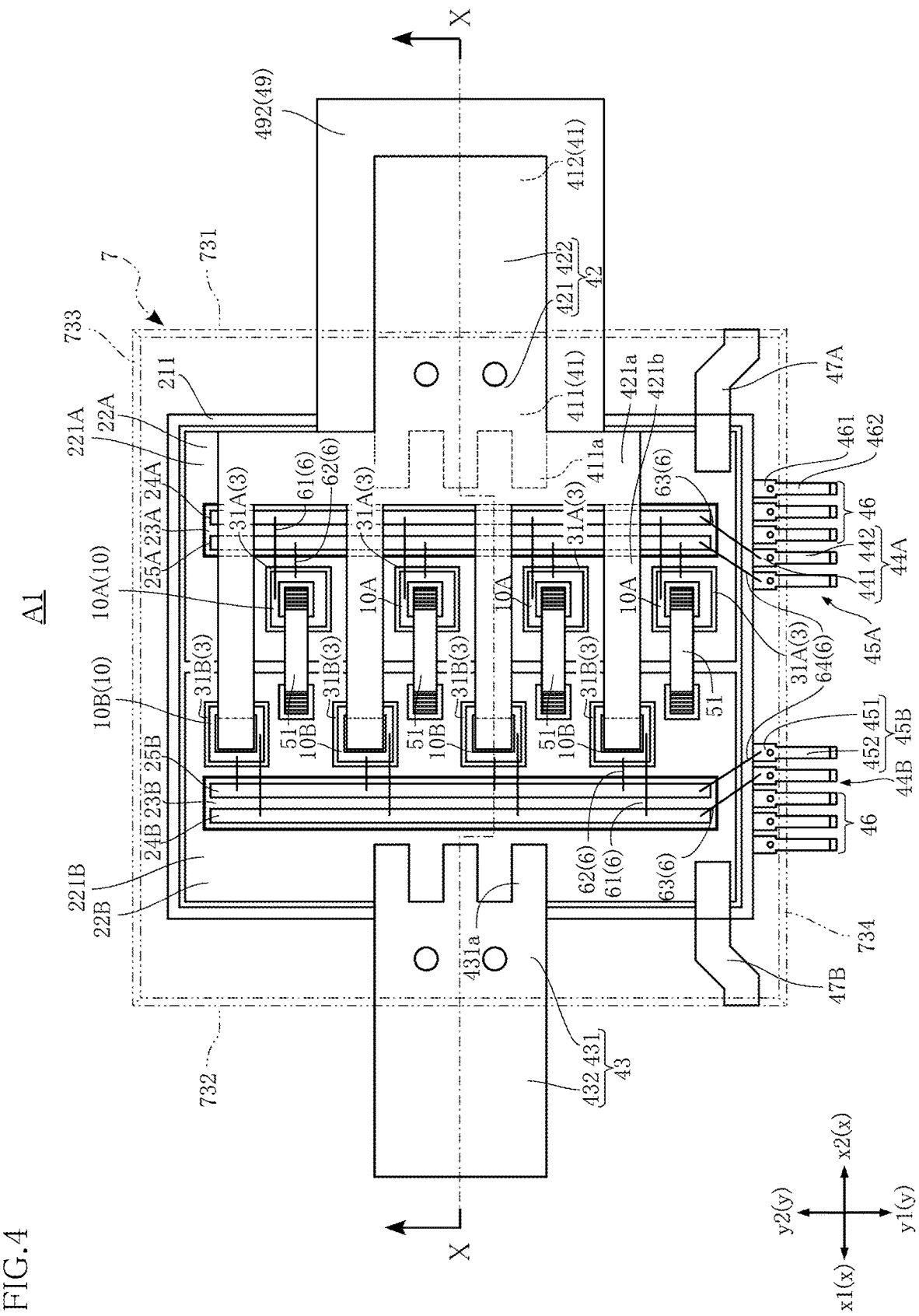
FIG. 4 is the plan view shown in FIG. 3 from which the sealing resin is omitted.
Figure 5:
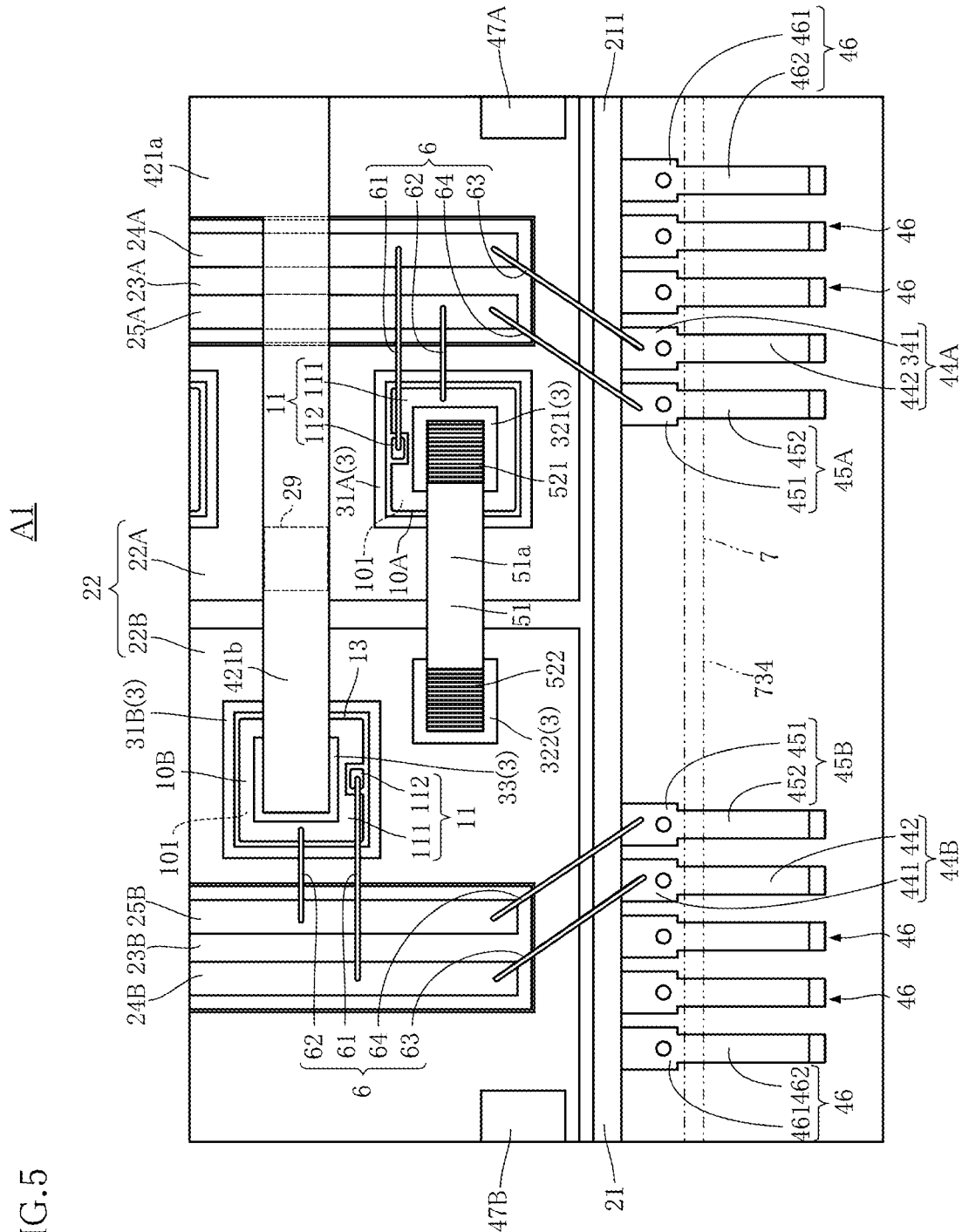
FIG. 5 is a partially enlarged view in which a portion of FIG. 4 is enlarged.
Figure 6:
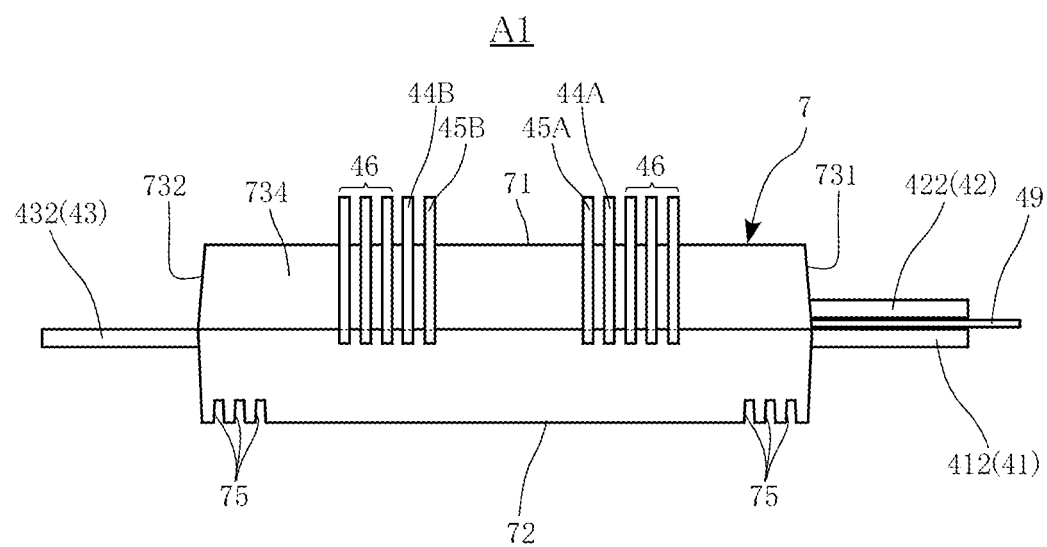
FIG. 6 is a front elevational view showing the semiconductor device according to the first embodiment.
Figure 6:
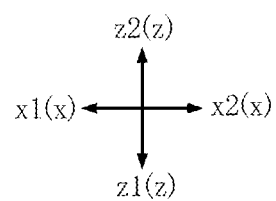
Figure 7:
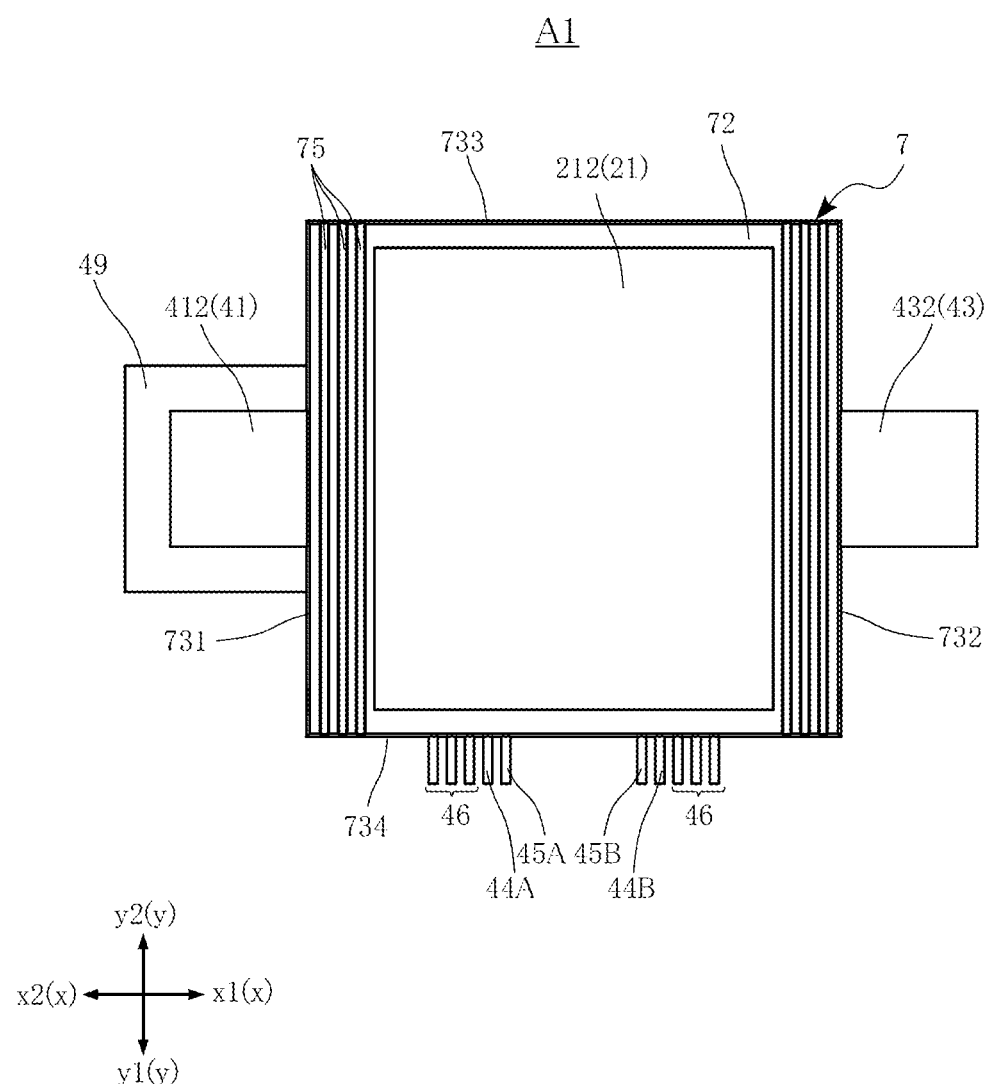
FIG. 7 is a bottom view showing the semiconductor device according to the first embodiment.
Figure 8:
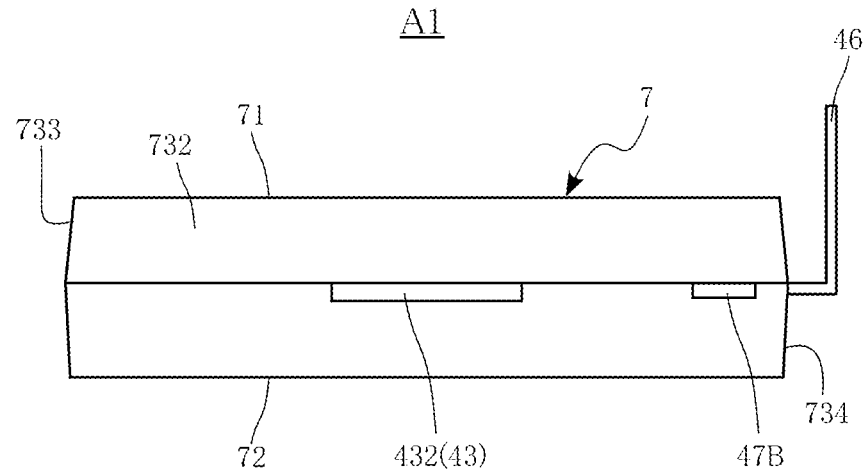
FIG. 8 is a left side view showing the semiconductor device according to the first embodiment.
Figure 8:
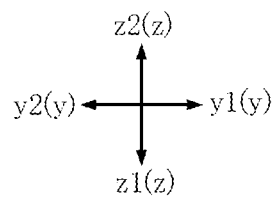
Figure 9:
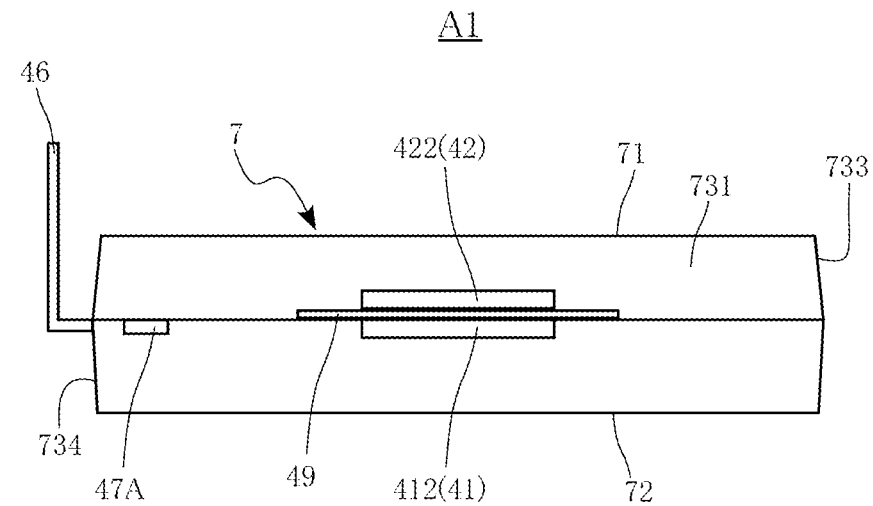
FIG. 9 is a right side view showing the semiconductor device according to the first embodiment.
Figure 9:
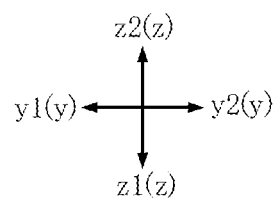
Figure 10:
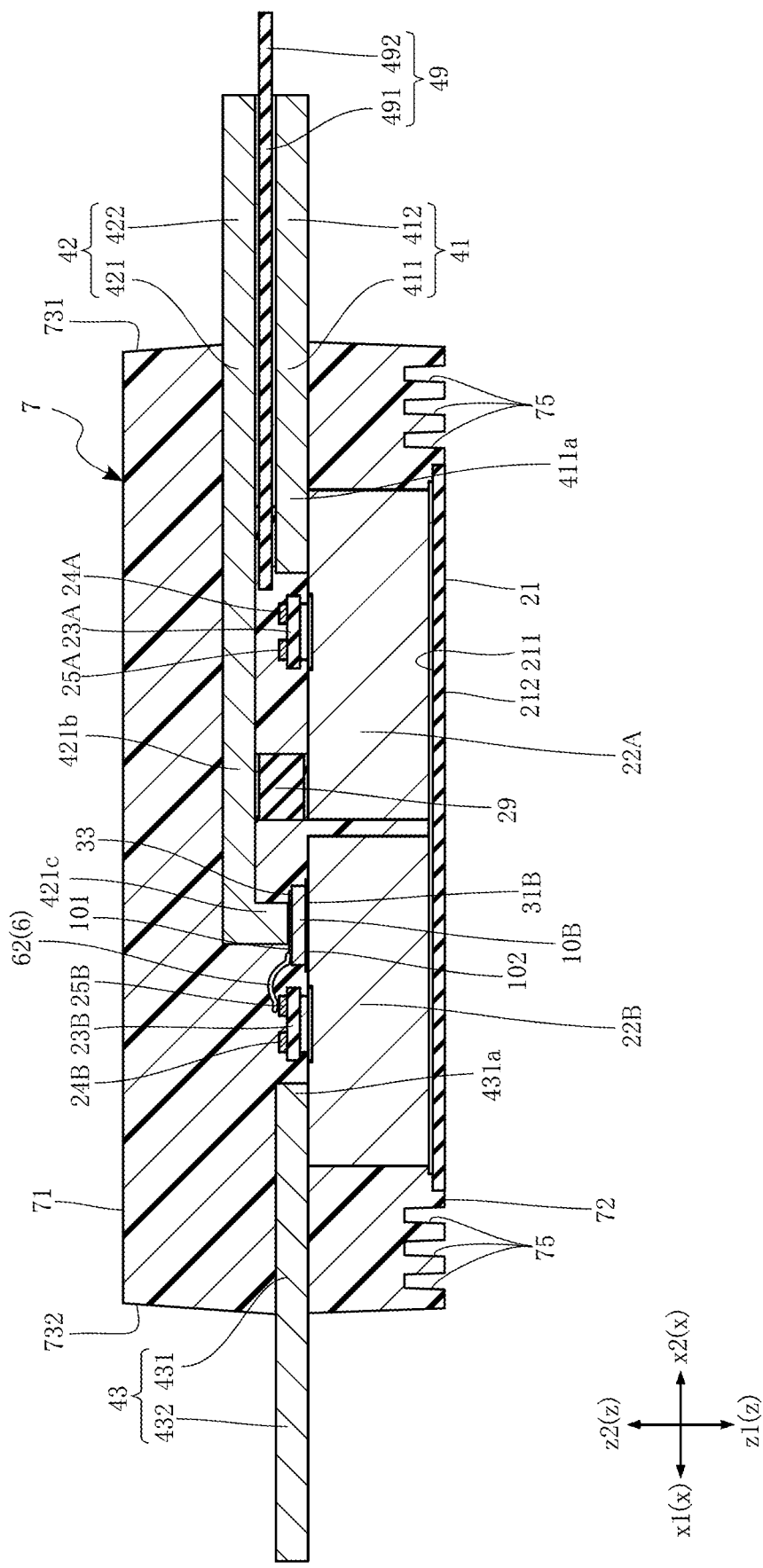
FIG. 10 is a cross-sectional view of FIG. 4 taken along a line X-X.
Figure 11:
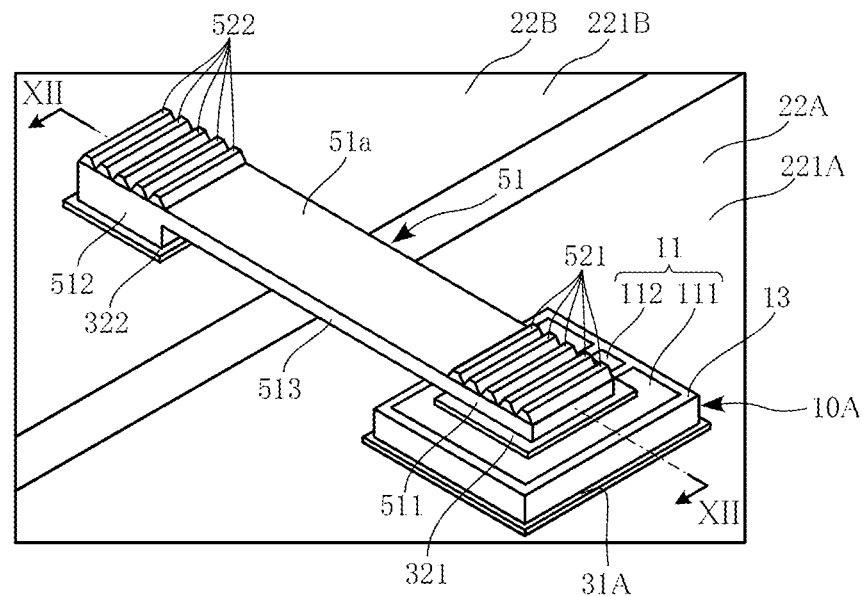
FIG. 11 is an enlarged view of a main part in which a portion of FIG. 2 is enlarged.
Figure 11:
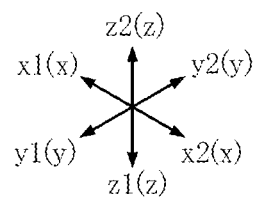
Figure 12:
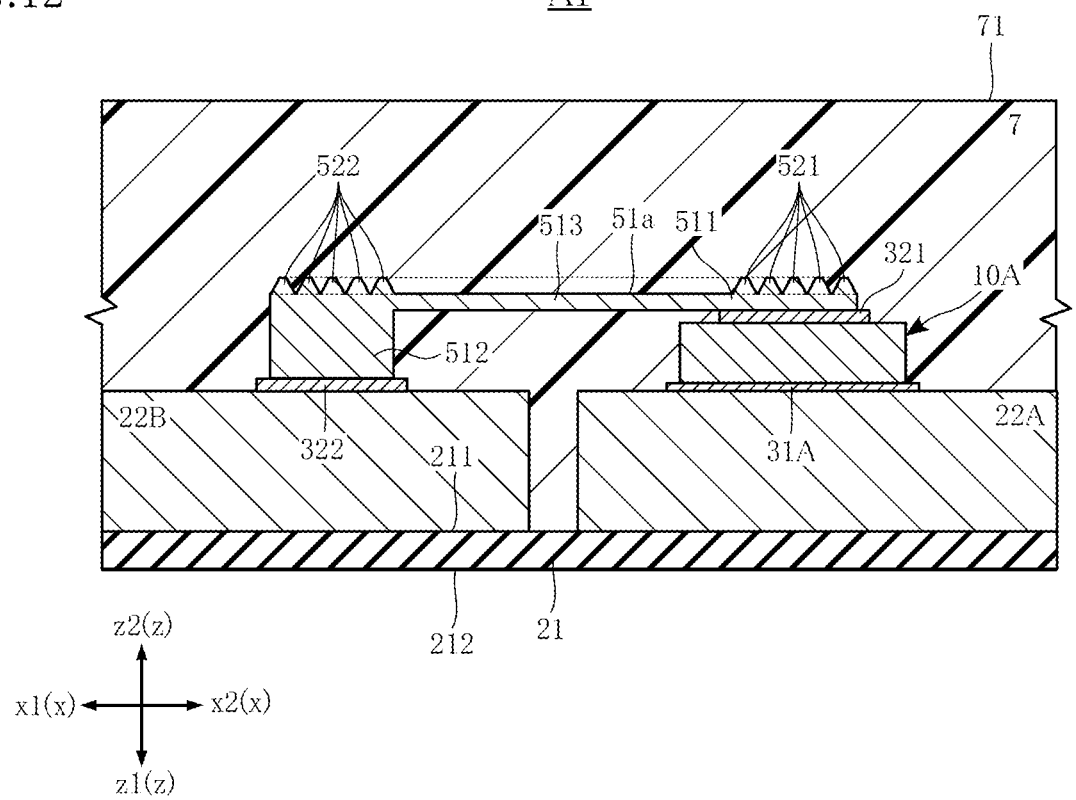
FIG. 12 is a cross-sectional view of FIG. 11 taken along a line XII-XII.
Figure 13:
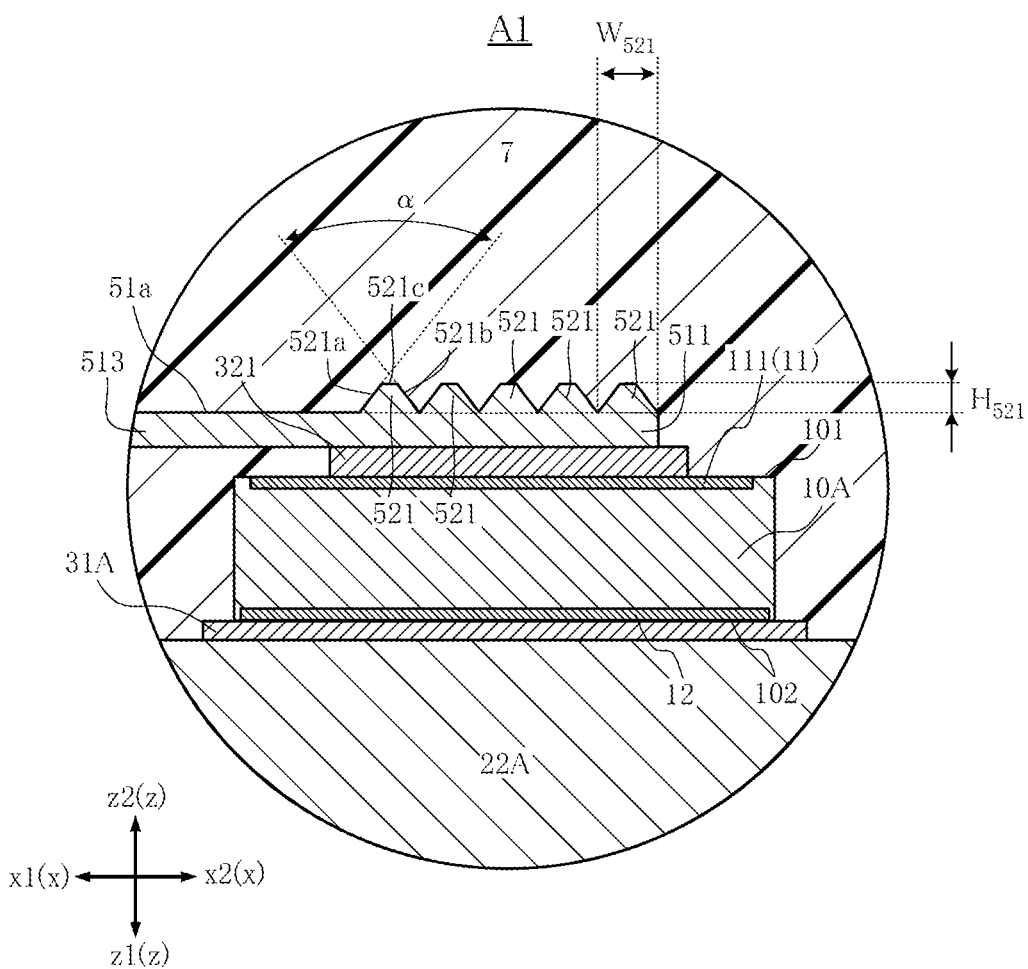
FIG. 13 is a partially enlarged view in which a portion of FIG. 12 is enlarged.
Figure 14:
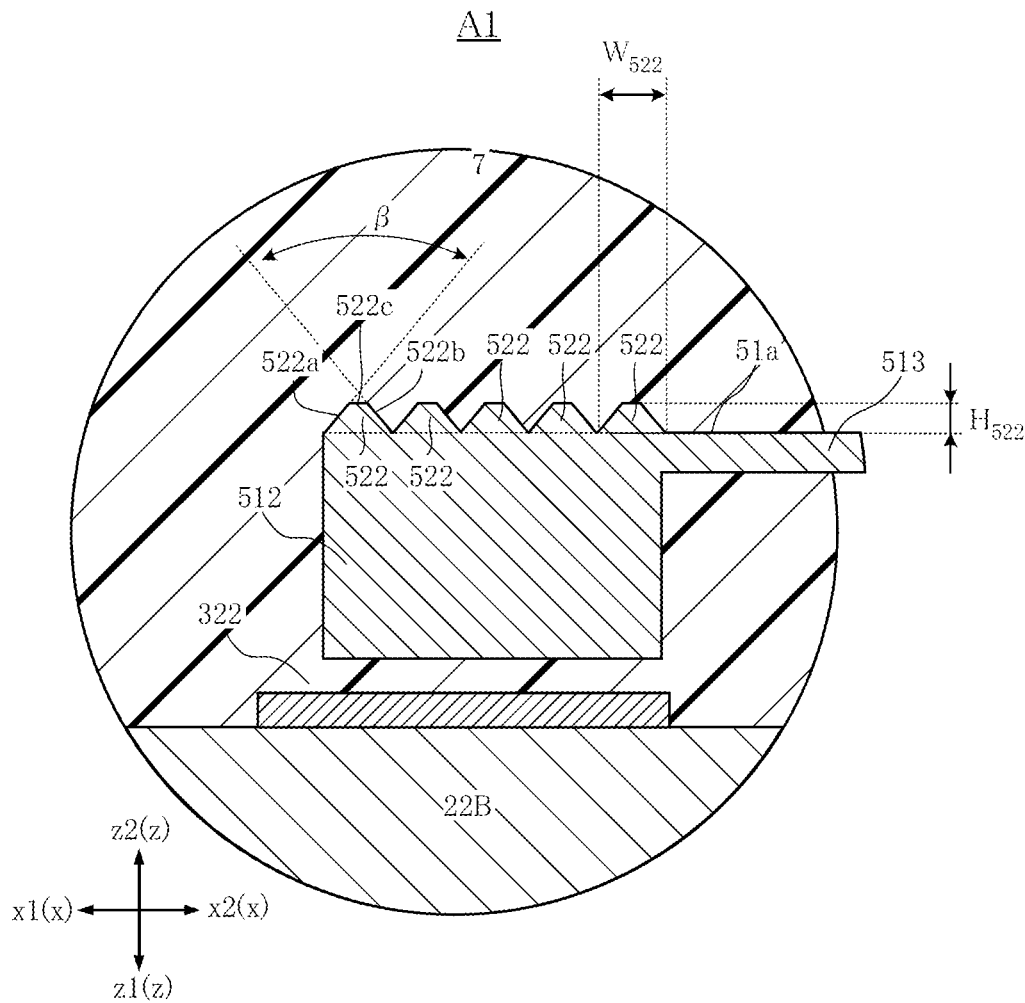
FIG. 14 is a partially enlarged view in which a portion of FIG. 12 is enlarged.

FIG. 1 is a perspective view of the semiconductor device A1. FIG. 2 is the perspective view shown in FIG. 1 from which the sealing resin 7 is omitted. FIG. 3 is a plan view showing the semiconductor device A1. FIG. 4 is the plan view shown in FIG. 3 from which the sealing resin 7 is omitted. Note that, in FIG. 4, the sealing resin 7 is indicated by imaginary lines (dash-double dot lines). FIG. 5 is a partially enlarged plan view in which a portion of FIG. 4 is enlarged. FIG. 6 is a front elevational view showing the semiconductor device A1. FIG. 7 is a bottom view showing the semiconductor device A1. FIG. 8 is a side view (left side view) showing the semiconductor device A1. FIG. 9 is a side view (right side view) showing the semiconductor device A1. FIG. 10 is a cross-sectional view of FIG. 4 taken along a line X-X. FIG. 11 is an enlarged view of a main part in which a portion including a lead member 51 in the perspective view shown in FIG. 2 is enlarged. FIG. 12 is a cross-sectional view of FIG. 11 taken along a line XII-XII. FIG. 13 is a partially enlarged view in which a portion of FIG. 12 is enlarged. FIG. 14 is a partially enlarged view in which a portion of FIG. 12 is enlarged. Note that the plurality of wire members 6 are omitted from FIGS. 11 to 13.

For convenience of description, three directions orthogonal to one another in FIGS. 1 to 14 are defined as a width direction x, a depth direction y, and a thickness direction z. The width direction x is a left-right direction in the plan view (see FIGS. 3 and 4) of the semiconductor device A1. The depth direction y is an upward-downward direction in the plan view (see FIGS. 3 and 4) of the semiconductor device A1. Note that a direction toward one side in the width direction x is referred to as a width direction x1, and a direction toward the other side in the width direction x is referred to as a width direction x2, as necessary. Similarly, a direction toward one side in the depth direction y is referred to as a depth direction y1, and a direction toward the other side in the depth direction y is referred to as a depth direction y2. A direction toward one side in the thickness direction z is referred to as a thickness direction z1, and a direction toward the other side in the thickness direction z is referred to as a thickness direction z2. Furthermore, the thickness direction z1 and the thickness direction z2 may also be referred to as below and above, respectively. The thickness direction z corresponds to a "first direction" of the present disclosure. In the present embodiment, the width direction x corresponds to a "third direction" of the present disclosure, and the depth direction y corresponds to a "second direction" of the present disclosure.

The plurality of semiconductor elements 10 are made of a semiconductor material mainly composed of SiC (silicon carbide). Note that the semiconductor material is not limited to SiC, and may alternatively be Si (silicon), GaAs (gallium arsenide), GaN (gallium nitride), or the like. In the present embodiment, the semiconductor elements 10 are MOSFETs (Metal-Oxide-Semiconductor Field-Effect Transistors).

Note that the plurality of semiconductor elements 10 are not limited to MOSFETs, and may alternatively be field effect transistors including MISFETs (Metal-Insulator-Semiconductor FETs), bipolar transistors such as IGBTs (Insulated Gate Bipolar Transistors), or IC chips such as LSIs. The present embodiment describes the case where the semiconductor elements 10 are the same elements and are n-channel MOSFETS. Each of the semiconductor elements 10 has a rectangular shape as viewed in the thickness direction z (hereinafter also referred to as "in a plan view"), but is not limited thereto. Each semiconductor element 10 has a thickness of about 350 to 370 μm. Note that the thickness of each semiconductor element 10 is not limited thereto.

As shown in FIGS. 10 and 13, each of the plurality of semiconductor elements 10 has an element obverse face 101 and an element reverse face 102. Note that FIGS. 10 and 13 show a semiconductor element 10A, but a semiconductor element 10B is also configured in the same manner. In each semiconductor element 10, the element obverse face 101 and the element reverse face 102 are spaced apart from each other in the thickness direction z and face toward opposite sides. In the present embodiment, the element obverse face 101 faces in the thickness direction z2, and the element reverse face 102 faces in the thickness direction z1.

As shown in FIGS. 5, 11, and 13, each of the plurality of semiconductor elements 10 has an obverse-face electrode 11, a reverse-face electrode 12, and an insulating film 13.

The obverse-face electrode 11 is provided on the element obverse face 101. As shown in FIG. 11, the obverse-face electrode 11 includes a first electrode 111 and a second electrode 112. In the present embodiment, the first electrode 111 is a source electrode, and a source current flows therethrough. In the present embodiment, the second electrode 112 is a gate electrode, and a gate voltage for driving the semiconductor element 10 is applied to the second electrode 112. The first electrode 111 is larger than the second electrode 112. Although the present embodiment describes the case where the first electrode 111 is constituted by one region, it may be divided into a plurality of regions.

The reverse-face electrode 12 is provided on the element reverse face 102. In the present embodiment, the reverse-face electrode 12 is formed over the entire element reverse face 102. In the present embodiment, the reverse-face electrode 12 is a drain electrode, and a drain current flows therethrough.

The insulating film 13 is provided on the element obverse face 101. The insulating film 13 is electrically insulating. The insulating film 13 surrounds the obverse-face electrode 11 in a plan view. The insulating film 13 is formed by, for example, stacking a $SiO_2$ (silicon dioxide) layer, a $SiN_4$ (silicon nitride) layer, and a polybenzoxazole layer in this order on the element obverse face 101. Note that the insulating film 13 may have a polyimide layer in place of the polybenzoxazole layer.

The plurality of semiconductor elements 10 includes a plurality of semiconductor elements 10A and a plurality of semiconductor elements 10B. In the present embodiment, the semiconductor device A1 constitutes a half-bridge switching circuit. The plurality of semiconductor elements 10A constitute an upper arm circuit in this switching circuit, and the plurality of semiconductor elements 10B constitute a lower arm circuit in this switching circuit. As shown in FIGS. 2 and 4, the semiconductor device A1 includes four semiconductor elements 10A and four semiconductor elements 10B. Note that the number of semiconductor elements 10 is not limited to that in this configuration, and can be freely set in accordance with the required performance of the semiconductor device A1.

As shown in FIGS. 2, 4, 5, 11, and 13, the plurality of semiconductor elements 10A are mounted on the support substrate 20 (later-described conductive member 22A). In the present embodiment, the plurality of semiconductor elements 10A are arranged in the depth direction y and are spaced apart from each other. When each semiconductor element 10A is in an orientation in which it is mounted on the conductive member 22A, the element reverse face 102 opposes the conductive member 22A. As shown in FIGS. 4, 5, 12 and 13, the semiconductor elements 10A are conductively bonded to the support substrate 20 (conductive member 22A) via the conductive bonding layer 3 (later-described element bonding layer 31A).

As shown in FIGS. 2, 4, 5, and 10, the plurality of semiconductor elements 10B are mounted on the support substrate 20 (later-described conductive member 22B). In the present embodiment, the plurality of semiconductor elements 10B are arranged in the depth direction y and are spaced apart from each other. When each semiconductor element 10B is in an orientation in which it is mounted on the conductive member 22B, the element reverse face 102 opposes the conductive member 22B. As shown in FIGS. 4, 5, and 10, the semiconductor elements 10B are conductively bonded to the support substrate 20 (conductive member 22B) via the conductive bonding layer 3 (later-described element bonding layer 31B).

The support substrate 20 is a support member that supports the plurality of semiconductor elements 10. The support substrate 20 includes an insulating substrate 21, a plurality of conductive members 22, a pair of insulating layers 23A and 23B, a pair of gate layers 24A and 24B, and a pair of detection layers 25A and 25B.

As shown in FIG. 10, the plurality of conductive members 22 are arranged on the insulating substrate 21. The insulating substrate 21 is electrically insulating. The component material of the insulating substrate 21 is, for example, a ceramic that has excellent thermal conductivity. Such a ceramic includes, for example, AlN (aluminum nitride), SiN (silicon nitride), $Al_2O_3$ (aluminum oxide), and the like. In the present embodiment, the insulating substrate 21 has a rectangular shape in a plan view.

As shown in FIG. 10, the insulating substrate 21 has a obverse face 211 and a reverse face 212. The obverse face 211 and the reverse face 212 are spaced apart from each other in the thickness direction z and face toward opposite sides. The obverse face 211 faces in the thickness direction z toward the side on which the plurality of conductive members 22 are arranged, i.e., in the thickness direction z2. The obverse face 211 is covered by the sealing resin 7 together with the plurality of conductive members 22 and the plurality of semiconductor elements 10. The reverse face 212 faces in the thickness direction z1. As shown in FIGS. 7 and 10, the reverse face 212 is exposed from the sealing resin 7. For example, a heat sink (not shown) or the like is connected to the reverse face 212. Note that the configuration of the insulating substrate 21 is not limited to the above-described configuration, and the insulating substrate 21 may be separately provided for each of the plurality of conductive members 22.

The plurality of conductive members 22 are metal plates. The component material of these metal plates is Cu or a Cu alloy. The plurality of conductive members 22 constitutes a conductive path to the plurality of semiconductor elements 10, together with a plurality of terminals 40. The plurality of conductive members 22 are spaced apart from each other, and are arranged on the obverse face 211 of the insulating substrate 21. The conductive members 22 are bonded to the obverse face 211 by means of a bonding material such as silver paste or solder. Note that the bonding material may be a conductive material, or may be an insulating material. In the present embodiment, the length in the thickness direction z of the conductive member 22 is about 0.4 to 3.0 mm, but is not limited thereto. Note that the surface of the conductive members 22 may be covered by silver plating.

The plurality of conductive members 22 include a conductive member 22A and a conductive member 22B. In the present embodiment, the conductive members 22A and 22B are arranged in the width direction x on the insulating substrate 21. As shown in FIGS. 2, 4, and 10, the conductive member 22A is arranged farther in the width direction x2 than the conductive member 22B. The conductive member 22A has an obverse face 221A that faces in the thickness direction z2, and the plurality of semiconductor elements 10A are mounted on the obverse face 221A. The conductive member 22B has an obverse face 221B that faces in the thickness direction z2, and the plurality of semiconductor elements 10B are mounted on the obverse face 221B. In the present embodiment, both the conductive members 22A and 22B have a rectangular shape in a plan view. Note that the configuration of the plurality of conductive members 22 is not limited to the above-described configuration, and can be changed as appropriate in accordance with the number of semiconductor elements 10 and the arrangement thereof. In the present embodiment, the conductive member 22A corresponds to a "first conductor" of the present disclosure, and the conductive member 22B corresponds to a "second conductor" of the present disclosure.

The pair of insulating layers 23A and 23B are electrically insulating, and the component material thereof is glass epoxy resin, for example. As shown in FIGS. 2 and 4, each of the two insulating layers 23A and 23B has a band shape extending in the depth direction y. As shown in FIGS. 2 and 4, the insulating layer 23A is bonded to the obverse face 221A of the conductive member 22A. The insulating layer 23A is located farther in the width direction x2 than the plurality of semiconductor elements 10A. As shown in FIGS. 2 and 4, the insulating layer 23B is bonded to the obverse face 221B of the conductive member 22B. The insulating layer 23B is located further in the width direction x1 than the semiconductor elements 10B.

The pair of gate layers 24A and 24B are conductive, and the component material thereof is Cu, for example. As shown in FIGS. 2 and 4, each of the two gate terminals 24A and 24B have a band shape extending in the depth direction y. As shown in FIGS. 2 and 4, the gate layer 24A is arranged on the insulating layer 23A. The gate layer 24A is electrically connected to the second electrodes 112 (gate electrodes) of the semiconductor elements 10A via the wire members 6 (later-described gate wires 61). As shown in FIGS. 2 and 4, the gate layer 24B is arranged on the insulating layer 23B. The gate layer 24B is electrically connected to the second electrodes 112 (gate electrodes) of the semiconductor elements 10B via the wire members 6 (later-described gate wires 61).

The pair of detection layers 25A and 25B are conductive, and the component material thereof is Cu, for example. As shown in FIGS. 2 and 4, each of the two detection layers 25A and 25B has a band shape extending in the depth direction y. As shown in FIGS. 2 and 4, the detection layer 25A is arranged on the insulating layer 23A together with the gate layer 24A. In a plan view, the detection layer 25A is located adjacent to the gate layer 24A and is spaced apart from the gate layer 24A on the insulating layer 23A. In the present embodiment, the detection layer 25A is arranged closer, in the width direction x, to the plurality of semiconductor elements 10A than the gate layer 24A. Accordingly, the detection layer 25A is located in the width direction x1 with respect to the gate layer 24A. Note that the arrangement in the width direction x of the gate layer 24A and the detection layer 25A may be reversed. The detection layer 25A is electrically connected to the first electrodes 111 (source electrodes) of the semiconductor elements 10A via the wire members 6 (later-described detection wires 62). As shown in FIGS. 2 and 4, the detection layer 25B is arranged together with the gate layer 24B on the insulating layer 23B. In a plan view, the detection layer 25B is located adjacent to the gate layer 24B and is spaced apart from the gate layer 24B on the insulating layer 23B. In the present embodiment, the detection layer 25B is arranged closer to the plurality of semiconductor elements 10B than the gate layer 24B. Accordingly, the detection layer 25B is located in the width direction x2 with respect to the gate layer 24B. Note that the arrangement in the width direction x of the gate layer 24B and the detection layer 25B may be reversed. The detection layer 25B is electrically connected to the first electrodes 111 (source electrodes) of the semiconductor elements 10B via the wire members 6 (later-described detection wires 62).

A plurality of base portions 29 are electrically insulating, and the component material thereof is a ceramic, for example. As shown in FIGS. 2 and 10, the base portions 29 are bonded to the obverse face 221A of the conductive member 22A. In the present embodiment, each base portion 29 has a rectangle shape in a plan view. The plurality of base portions 29 are arranged in the depth direction y and are spaced apart from each other. The length in the thickness direction z of each base portion 29 is substantially the same as the sum of the length in the thickness direction z of the input terminal 41 and the length in the thickness direction z of the insulating member 49. A portion of the input terminal 42 is bonded to each base portion 29, and the base portions 29 support the input terminal 42. Accordingly, the base portions 29 stabilize the orientation of the input terminal 42. Note that in the present embodiment, the semiconductor device A1 need not include the plurality of base portions 29.

The plurality of conductive bonding layers 3 are made of sintered metal that is formed through sintering treatment. The component material of the conductive bonding layers 3 is sintered silver, for example, but is not limited thereto and may be any other sintered metal, such as sintered copper. The conductive bonding layers 3 are porous and have many micropores. In the present embodiment, the micropores are voids, but for example, these micropores may be filled with epoxy resin. That is to say, the conductive bonding layers 3 may be sintered metal that contains epoxy resin. However, if the content of the epoxy resin is high, the conductivity of the conductive bonding layers 3 is degraded. For this reason, the content of epoxy resin is set in consideration of the amount of current in the semiconductor device A1. The conductive bonding layers 3 may be formed by subjecting a sintering metallic material to the aforementioned sintering treatment. Note that the present embodiment describes the case where each conductive bonding layer 3 has a rectangular shape in the cross-sectional views shown in FIGS. 12 to 14, for example, but each conductive bonding layer 3 may alternatively have a trapezoidal shape, or may be curved on a side, or may be formed into a fillet.

In the present embodiment, the plurality of conductive bonding layers 3 include a plurality of element bonding layers 31A and 31B, a plurality of lead bonding layers 321 and 322, and a plurality of terminal bonding layers 33.

The plurality of element bonding layers 31A are for bonding the semiconductor elements 10A to the conductive member 22A. The element bonding layers 31A are disposed between the element reverse faces 102 of the semiconductor elements 10A and the conductive member 22A, and electrically connect the reverse-face electrodes 12 of the semiconductor elements 10A and the conductive member 22A to each other. Each element bonding layers 31A has a thickness of about 30 μm. Note that the thickness of each element bonding layer 31A is not limited thereto. In the present embodiment, each element bonding layer 31A corresponds to a "third bonding layer" of the present disclosure.

The plurality of element bonding layers 31B are for bonding the semiconductor elements 10B to the conductive member 22B. The element bonding layers 31B are disposed between the element reverse faces 102 of the semiconductor elements 10B and the conductive member 22B, and electrically connect the reverse-face electrodes 12 of the semiconductor elements 10B and the conductive member 22B to each other. Each element bonding layer 31B has a thickness of about 30 μm, similarly to the element bonding layers 31A. Note that the thickness of each element bonding layer 31B is not limited thereto.

The plurality of lead bonding layers 321 and 322 are for bonding the lead members 51.

The plurality of lead bonding layers 321 are for bonding a portion of each lead member 51 to the corresponding semiconductor element 10A. Each lead bonding layer 321 is disposed between the element obverse face 101 of the corresponding semiconductor element 10A and a portion (later-described first bonding portion 511) of the corresponding lead member 51, and electrically connects the obverse-face electrode 11 (first electrode 111) of the semiconductor element 10A and the lead member 51 to each other. Each lead bonding layer 321 has a thickness of about 80 μm. Note that the thickness of each lead bonding layer 321 is not limited thereto. In the present embodiment, each lead bonding layer 321 corresponds to a "first bonding layer" of the present disclosure.

The plurality of lead bonding layers 322 are for bonding a portion of each lead member 51 to the conductive member 22B. Each lead bonding layer 322 is disposed between a portion (later-described second bonding portion 512) of the corresponding lead member 51 and a portion of the conductive member 22B, and electrically connects the lead member 51 and the conductive member 22B to each other. Each lead bonding layer 322 has a thickness of about 80 μm. Note that the thickness of each lead bonding layer 322 is not limited thereto. In the present embodiment, each lead bonding layer 322 corresponds to a "second bonding layer" of the present disclosure.

The plurality of terminal bonding layers 33 are for bonding the input terminal 42 to the semiconductor elements 10B. Each terminal bonding layer 33 is disposed between a portion (later-described protruding portion 421c) of the input terminal 42 and the element obverse face 101 of the corresponding semiconductor element 10B, and electrically connects the obverse-face electrode 11 (first electrode 111) of the semiconductor element 10B and the input terminal 42 to each other. Each terminal bonding layer 33 has a thickness of about 80 μm. Note that the thickness of each terminal bonding layer 33 is not limited thereto.

The two input terminals 41 and 42 are metal plates. The component material of these metal plates is Cu or a Cu alloy. In the present embodiment, both the two input terminals 41 and 42 have a length in the thickness direction z of 0.8 mm, but the length is not limited thereto. As shown in FIGS. 4 and 10, both the two input terminals 41 and 42 are located on the side in the width direction x2 in the semiconductor device A1. For example, a power supply voltage is applied between the two input terminals 41 and 42. Note that the power supply voltage may be directly applied between the input terminals 41 and 42 from a power supply (not shown), or a bus bar (not shown) may be connected so as to sandwich the input terminals 41 and 42 such that the power supply voltage is applied therebetween via the bus bar. A snubber circuit or the like may also be connected in parallel thereto. The input terminal 41 is a positive terminal (P-terminal), and the input terminal 42 is a negative terminal (N-terminal). The input terminal 42 is arranged spaced apart, in the thickness direction z, from both the input terminal 41 and the conductive member 22A.

As shown in FIGS. 4 and 10, the input terminal 41 has a pad portion 411 and a terminal portion 412.

The pad portion 411 is a portion of the input terminal 41 that is covered by the sealing resin 7. An end portion in the width direction x1 of the pad portion 411 has a comb-toothed shape, and includes a plurality of comb-toothed portions 411a. The plurality of comb-toothed portions 411a are conductively bonded to the obverse face 221A of the conductive member 22A. The bonding method may be bonding by means of welding using a laser beam, or may be ultrasonic bonding, or may be bonding using a conductive bonding material.

The terminal portion 412 is a portion of the input terminal 41 that is exposed from the sealing resin 7. As shown in FIGS. 7, 9, and 10, the terminal portion 412 extends in the width direction x2 from the sealing resin 7 in a plan view.

As shown in FIGS. 4 and 10, the input terminal 42 has a pad portion 421 and a terminal portion 422.

The pad portion 421 is a portion of the input terminal 42 that is covered by the sealing resin 7. The pad portion 421 includes a connecting portion 421a, a plurality of extending portions 421b, and a plurality of protruding portions 421c. The connecting portion 421a has a band shape extending in the depth direction y. The connecting portion 421a is connected to the terminal portion 422. Each of the plurality of extending portions 421b has a band shape extending in the width direction x1 from the connecting portion 421a. In the present embodiment, each extending portion 421b extends from the connecting portion 421a until overlapping with the corresponding semiconductor element 10B in a plan view. The plurality of extending portions 421b are arranged in the depth direction y and are spaced apart from each other in a plan view. A portion of a face of each extending portion 421b that faces in the thickness direction z1 is in contact with the corresponding base portion 29, and is supported by the conductive member 22A via this base portion 29. Each of the plurality of protruding portions 421c is a portion that protrudes in the thickness direction z1 from the corresponding extending portion 421b at a leading end portion (edge portion in the width direction x1) of the extending portion 421b. A difference in the height in the thickness direction z between the extending portions 421b and the semiconductor elements 10B is eliminated by the protruding portions 421c. The protruding portions 421c are bonded to the semiconductor elements 10B (obverse-face electrodes 11) via the terminal bonding layers 33.

The terminal portion 422 is a portion of the input terminal 42 that is exposed from the sealing resin 7. As shown in FIGS. 4 and 10, the terminal portion 422 extends in the width direction x2 from the sealing resin 7 in a plan view.

The terminal portion 422 has a rectangular shape in a plan view. As shown in FIGS. 4 and 10, the terminal portion 422 overlaps with the terminal portion 412 of the input terminal 41 in a plan view. The terminal portion 422 is spaced apart from the terminal portion 412 in the thickness direction z2. Note that in the present embodiment, the shape of the terminal portion 422 is the same as the shape of the terminal portion 412.

The output terminal 43 is a metal plate. The component material of this metal plate is Cu or a Cu alloy, for example. As shown in FIGS. 2 and 4, the output terminal 43 is located on the side in the width direction x1 in the semiconductor device A1. AC power (voltage) obtained through power conversion by the plurality of semiconductor elements 10 is output from this output terminal 43.

As shown in FIGS. 2 and 4, the output terminal 43 includes a pad portion 431 and a terminal portion 432.

The pad portion 431 is a portion of the output terminal 43 that is covered by the sealing resin 7. A portion of the pad portion 431 on the side in the width direction x2 has a comb-toothed shape, and includes a plurality of comb-toothed portions 431a. The plurality of comb-toothed portions 431a are conductively bonded to the obverse face 221B of the conductive member 22B. The bonding method may be bonding by means of laser welding using a laser beam, or may be ultrasonic bonding, or may be bonding using a conductive bonding material.

The terminal portion 432 is a portion of the output terminal 43 that is exposed from the sealing resin 7. As shown in FIGS. 3, 6, 7, 8, and 10, the terminal portion 432 extends in the width direction x1 from the sealing resin 7.

As shown in FIGS. 1 to 7, the two gate terminals 44A and 44B are located adjacent, in the depth direction y, to the respective conductive members 22A and 22B. A gate voltage for driving the plurality of semiconductor elements 10A is applied to the gate terminal 44A. A gate voltage for driving the plurality of semiconductor elements 10B is applied to the gate terminal 44B.

As shown in FIGS. 4 and 5, each of the two gate terminals 44A and 44B has a pad portion 441 and a terminal portion 442. The pad portion 441 of each of the gate terminals 44A and 44B is covered by the sealing resin 7. Thus, the gate terminals 44A and 44B are supported by the sealing resin 7. Note that the surface of the pad portion 441 may be silver-plated, for example. The terminal portion 442 is connected to the pad portion 441, and is exposed from the sealing resin 7. The terminal portion 442 forms an L shape as viewed in the width direction x.

As shown in FIGS. 1 to 7, the two detection terminals 45A and 45B are located adjacent, in the width direction x, to the gate terminals 44A and 44B, respectively. A voltage (a voltage corresponding to the source current) applied to the obverse-face electrodes 11 (first electrodes 111) of the plurality of semiconductor elements 10A is detected from the detection terminal 45A. A voltage (a voltage corresponding to the source current) applied to the obverse-face electrodes 11 (first electrodes 111) of the plurality of semiconductor elements 10B is detected from the detection terminal 45B.

As shown in FIGS. 4 and 5, each of the two detection terminals 45A and 45B has a pad portion 451 and a terminal portion 452. The pad portion 451 of each of the detection terminals 45A and 45B is covered by the sealing resin 7. Thus, the detection terminals 45A and 45B are supported by the sealing resin 7. Note that the surface of the pad portion 451 may be silver-plated, for example. The terminal portion 452 is connected to the pad portion 451, and is exposed from the sealing resin 7. The terminal portion 452 forms an L shape as viewed in the width direction x.

As shown in FIGS. 1 to 7, the plurality of dummy terminals 46 are located on the side opposite, in the width direction x, to the pair of gate terminals 44A and 44B with respect to the pair of detection terminals 45A and 45B. In the present embodiment, six dummy terminals 46 are provided. Three of these dummy terminals 46 are located on one side of the width direction x (i.e., in the width direction x2). The remaining three dummy terminals 46 are located on the other side in the width direction x (i.e., in the width direction x1). Note that the configuration of the plurality of dummy terminals 46 is not limited to the above-described configuration. A configuration in which the plurality of dummy terminals 46 are not provided may alternatively be employed.

As shown in FIGS. 4 and 5, each of the plurality of dummy terminals 46 has a pad portion 461 and a terminal portion 462. In each dummy terminal 46, the pad portion 461 is covered by the sealing resin 7. Thus, the plurality of dummy terminals 46 are supported by the sealing resin 7. Note that the surface of the pad portion 461 may be silver-plated, for example. The terminal portion 462 is connected to the pad portion 461, and is exposed from the sealing resin 7. The terminal portion 462 forms an L shape as viewed in the width direction x. Note that the shape of the terminal portion 462 is the same as the shape of the terminal portion 442 of each of the two gate terminals 44A and 44B and the shape of the terminal portion 452 of each of the two detection terminals 45A and 45B.

As shown in FIG. 4, the pair of side terminals 47A and 47B overlap with edge portions in the depth direction y1 of the sealing resin 7 on respective sides in the width direction x of the sealing resin 7 in a plan view. The side terminal 47A is bonded to the conductive member 22A and is covered by the sealing resin 7 except for an end face that faces in the width direction x2. The side terminal 47B is bonded to the conductive member 22B and is covered by the sealing resin 7 except for an end face that faces in the width direction x1. In the present embodiment, the entire side terminals 47A and 47B overlap with the sealing resin 7 in a plan view. The method for bonding the side terminals 47A and 47B may be bonding by means of laser welding, or may be ultrasonic bonding, or may be bonding using a conductive bonding material. A portion of each of the side terminals 47A and 47B bend in a plan view, and another portion bend in the thickness direction z. Note that the configuration of the side terminals 47A and 47B is not limited thereto. For example, the side terminals 47A and 47B may extend to protrude from the sealing resin 7 in a plan view. Alternatively, the semiconductor device A1 need not include the side terminals 47A and 47B.

The pair of gate terminals 44A and 44B, the pair of detection terminals 45A and 45B, and the plurality of dummy terminals 46 are arranged along the width direction x in a plan view, as shown in FIGS. 1 to 7. In the semiconductor device A1, all of the pair of gate terminals 44A and 44B, the pair of detection terminals 45A and 45B, the plurality of dummy terminals 46, and the pair of side terminals 47A and 47B are formed from the same lead frame.

The insulating member 49 is electrically insulating, and the component material thereof is insulating paper, for example. A portion of the insulating member 49 is a flat plate, and is sandwiched, in the thickness direction z, by the terminal portion 412 of the input terminal 41 and the terminal portion 422 of the input terminal 42, as shown in FIGS. 6, 9, and 10. The entire input terminal 41 overlaps with the insulating member 49 in a plan view. As for the input terminal 42, a portion of the pad portion 421 and the entire terminal portion 422 overlap with the insulating member 49 in a plan view. The two input terminals 41 and 42 are insulated from each other by the insulating member 49. A portion (a portion on the side in the width direction x1) of the insulating member 49 is covered by the sealing resin 7.

As shown in FIG. 4, the insulating member 49 has an interposing portion 491 and an extending portion 492. The interposing portion 491 is disposed, in the thickness direction z, between the terminal portion 412 of the input terminal 41 and the terminal portion 422 of the input terminal 42. The entire interposing portion 491 is sandwiched by the terminal portion 412 and the terminal portion 422. The extending portion 492 extends further in the width direction x2 from the interposing portion 491 than the terminal portion 412 and the terminal portion 422.

The plurality of lead members 51 are for connecting the semiconductor elements 10A and the conductive member 22B to each other. Each lead member 51 has a rectangular shape extending in the width direction x in a plan view. Each lead member 51 is a plate-shaped connecting member. Each lead member 51 corresponds to a "connecting member" of the present disclosure. Each lead member 51 includes a first bonding portion 511, a second bonding portion 512, and a connecting portion 513.

The first bonding portion 511 is a portion that is bonded to the obverse-face electrode 11 (first electrode 111) of the corresponding semiconductor element 10A via the corresponding conductive bonding layer 3 (lead bonding layer 321). The first bonding layer 511 overlaps with the first electrode 111 of the semiconductor element 10A, the lead bonding layer 321, and the semiconductor element 10A in a plan view. In the present embodiment, the first bonding portion 511 has a length in the thickness direction z (thickness) of about 160 to 200 μm. Note that the thickness of the first bonding portion 511 is not limited thereto.

The second bonding portion 512 is a portion that is bonded to the conductive member 22B via the corresponding conductive bonding layer 3 (lead bonding layer 322). The second bonding portion 512 overlaps with the lead bonding layer 322 in a plan view. The thickness of the second bonding portion 512 is larger than the thickness of the first bonding portion 511. In the present embodiment, the second bonding portion 512 has a length in the thickness direction z (thickness) of about 550 to 590 μm. Note that the thickness of the second bonding portion 512 is not limited thereto.

The connecting portion 513 is a portion connected to the first bonding portion 511 and the second bonding portion 512. A face of the connecting portion 513 that faces in the thickness direction z2 is in contact with the sealing resin 7. The thickness of the connecting portion 513 is the same as the thickness of the first bonding portion 511. Accordingly, in the present embodiment, the connecting portion 513 has a length in the thickness direction z (thickness) of about 160 to 200 μm. Note that the thickness of the connecting portion 513 is not limited thereto. The connecting portion 513 overlaps with the first bonding portion 511 as viewed in the width direction x.

Each lead member 51 has a lead obverse face 51a. The lead obverse face 51a faces in the thickness direction z2. In the present embodiment, the lead obverse face 51a is substantially flat. The lead obverse face 51a includes faces of the first bonding portion 511, the second bonding portion 512, and the connecting portion 513 that face in the thickness direction z2. In the present embodiment, the lead obverse face 51a corresponds to a "connecting member obverse face" of the present disclosure.

Each lead member 51 includes a plurality of protrusions 521 and a plurality of protrusions 522 that protrude in the thickness direction z2 from the lead obverse face 51a. Each of the plurality of protrusions 521 and 522 extends in the depth direction y in a plan view, and has a trapezoidal shape as viewed in the depth direction y. Note that each of the protrusions 521 and 522 may alternatively extend in the width direction x in a plan view and have a trapezoidal shape as viewed in the width direction x. In the present embodiment, the plurality of protrusions 521 are continuously arranged without a gap as viewed in the depth direction y. Similarly, the plurality of protrusions 522 are continuously arranged without a gap as viewed in the depth direction y. The plurality of protrusions 521 and 522 may be formed through metal processing (e.g., rolling) using a roller. Note that the method for forming the plurality or protrusions 521 and 522 is not limited thereto, and may alternatively be metal molding, chemical processing (e.g., etching), or the like.

In a plan view, the plurality of protrusions 521 overlap with the lead bonding layer 321, the first electrode 111 of the semiconductor element 10A, and the element bonding layer 31A. The plurality of protrusions 521 are formed in the first bonding portion 511. Each protrusion 521 has a length in the width direction x (width) $W_{521}$ of about 0.4 to 0.67 μm. Each protrusion 521 has a length in the thickness direction z (height) $H_{521}$ of about 0.14 to 0.43 μm. Note that the number of protrusions 521 and the length of each protrusion 521 are not specifically limited. In the present embodiment, each protrusion 521 corresponds to a "first protrusion" of the present disclosure. Each protrusion 521 includes a pair of side faces 521a and 521b and a top face 521c.

The pair of side faces 521a and 521b are formed so as to rise from the lead obverse face 51a. In the present embodiment, the side faces 521a and 521b are inclined with respect to the lead obverse face 51a. In the present embodiment, an angle α (see FIG. 13) formed by the pair of side faces 521a and 521b is about 60 to 120°. Note that the angle α is not limited thereto, and may alternatively be an acute angle, for example. The pair of side faces 521a and 521b are spaced apart from each other in the width direction x, and face toward opposite sides. In the present embodiment, the pair of side faces 521a and 521b correspond to a "pair of first side faces" of the present disclosure.

The top face 521c is connected to the pair of side faces 521a and 521b. The top face 521c faces in the same direction as the lead obverse face 51a does. The top face 521c is flat. A plurality of the top faces 521c of the plurality of protrusions 521 are located in one plane. In the present embodiment, the top face 521c corresponds to a "first top face" of the present disclosure.

The plurality of protrusions 522 overlap with the lead bonding layer 322 in a plan view. The plurality of protrusions 522 are formed in the second bonding portion 512. Each protrusion 522 has substantially the same size as each protrusion 521. Accordingly, each protrusion 522 has a length in the width direction x (width) $W_{522}$ of 0.4 to 0.67 μm, and a length in the thickness direction z (height) $H_{522}$ of 0.14 to 0.43 μm. Note that the number of protrusions 522 and the length of each protrusion 522 are not specifically limited. In the present embodiment, each protrusion 522 corresponds to a "second protrusion" of the present disclosure. Each protrusion 522 includes a pair of side faces 522a and 522b and a top face 522c.

The pair of side faces 522a and 522b are formed so as to rise from the lead obverse face 51a. In the present embodiment, the side faces 522a and 522b are inclined with respect to the lead obverse face 51a. In the present embodiment, an angle β (see FIG. 14) formed by the pair of side faces 522a and 522b is about 60 to 120°. Note that the angle β is not limited thereto, and may alternatively be an acute angle, for example. The pair of side faces 522a and 522b are spaced apart from each other in the width direction x, and face toward opposite sides. In the present embodiment, the pair of side faces 522a and 522b correspond to a "pair of second side faces" of the present disclosure.

The top face 522c is connected to the pair of side faces 522a and 522b. In the present embodiment, the top face 522c faces in the same direction as the lead obverse face 51a does. The top face 522c is flat. A plurality of the top faces 522c of the plurality of protrusions 522 are located in one plane. In the present embodiment, the plurality of top faces 521c and the plurality of top faces 522c are located in one plane. In the present embodiment, the top face 522c corresponds to a "second top face" of the present disclosure.

The plurality of wire members 6 are so-called bonding wires. Each wire member 6 is conductive, and the component material thereof is any one of Al (aluminum), Au (gold), and Cu, for example. In the present embodiment, the plurality of wire members 6 include a plurality of gate wires 61, a plurality of detection wires 62, a pair of first connection wires 63, and a pair of second connection wires 64, as shown in FIGS. 4 and 5.

As shown in FIGS. 4 and 5, one end of each of the plurality of gate wires 61 is bonded to the second electrode 112 (gate electrode) of the corresponding semiconductor element 10, and the other end is bonded to one of the two gate layers 24A and 24B. The plurality of gate wires 61 include gate wires 61 that electrically connect the second electrodes 112 of the semiconductor elements 10A and the gate layer 24A to each other, and gate wires 61 that electrically connect the second electrodes 112 of the semiconductor elements 10B and the gate layer 24B to each other.

As shown in FIGS. 4 and 5, one end of each of the plurality of detection wires 62 is bonded to the first electrode 111 (source electrode) of the corresponding semiconductor element 10, and the other end is bonded to one of the two detection layers 25A and 25B. The plurality of detection wires 62 include detection wires 62 that electrically connect the first electrodes 111 of the semiconductor elements 10A and the detection layer 25A to each other, and detection wires 62 that electrically connect the first electrodes 111 of the semiconductor elements 10B and the detection layer 25B to each other.

As shown in FIGS. 4 and 5, one of the two first connection wires 63 connects the gate layer 24A and the gate terminal 44A to each other, and the other one connects the gate layer 24B and the gate terminal 44B to each other. One end of one of the first connection wires 63 is bonded to the gate layer 24A, and the other end is bonded to the pad portion 441 of the gate terminal 44A, thus electrically connecting the gate layer 24A and the gate terminal 44A to each other. One end of the other one of the first connection wires 63 is bonded to the gate layer 24B, and the other end is bonded to the pad portion 441 of the gate terminal 44B, thus electrically connecting the gate layer 24B and the gate terminal 44B to each other.

As shown in FIGS. 4 and 5, one of the two second connection wires 64 connects the detection layer 25A and the detection terminal 45A to each other, and the other one connects the detection layer 25B and the detection layer 45B to each other. One end of one of the second connection wires 64 is bonded to the detection layer 25A, and the other end is bonded to the pad portion 451 of the detection terminal 45A, thus electrically connecting the detection layer 25A and the detection terminal 45A to each other. One end of the other one of the second connection wires 64 is bonded to the detection layer 25B, and the other end is bonded to the pad portion 451 of the detection terminal 45B, thus electrically connecting the detection layer 25B and the detection terminal 45B to each other.

As shown in FIGS. 1, 3, 4, and 6 to 10, the sealing resin 7 covers the plurality of semiconductor elements 10, a portion of the support substrate 20, the plurality of conductive bonding layers 3, a portion of each terminal 40, the plurality of lead members 51, and the plurality of wire members 6. The component material of the sealing resin 7 is epoxy resin, for example. As shown in FIGS. 1, 3, 4, and 6 to 10, the sealing resin 7 has a resin obverse face 71, a resin reverse face 72, and a plurality of resin side faces 731 to 734.

The resin obverse face 71 and the resin reverse face 72 are spaced apart from each other in the thickness direction z, and faces toward opposite sides. The resin obverse face 71 faces in the thickness direction z2, and the resin reverse face 72 faces in the thickness direction z1. As shown in FIG. 7, the resin reverse face 72 has a frame shape that surrounds the reverse face 212 of the insulating substrate 21 in a plan view. The reverse face 212 of the insulating substrate 21 is exposed from the resin reverse face 72. Each of the plurality of resin side faces 731 to 734 are connected to both the resin obverse face 71 and the resin reverse face 72, and are sandwiched by the resin obverse face 71 and the resin reverse face 72 in the thickness direction z. In the present embodiment, the resin side faces 731 and 732 are spaced apart from each other in the width direction x, and face toward opposite sides. The resin side face 731 faces in the width direction x2, and the resin side face 732 faces in the width direction x1. The resin side faces 733 and 734 are spaced apart from each other in the depth direction y, and face toward opposite sides. The resin side face 733 faces in the depth direction y2, and the resin side face 734 faces in the depth direction y1.

In the present embodiment, the sealing resin 7 includes a plurality of recessed portions 75 that are recessed in the thickness direction z from the resin reverse face 72, as shown in FIGS. 6, 7, and 10. Note that the sealing resin 7 need not include these recessed portions 75. The plurality of recessed portions 75 extend in the depth direction y, and are continuous from an edge in the depth direction y1 to an edge in the depth direction y2 of the resin reverse face 72 in a plan view. In the present embodiment, three recessed portions 75 are formed on each side in the width direction x of the reverse face 212 of the insulating substrate 21 in a plan view.

Next, a method for manufacturing the semiconductor device A1 according to the first embodiment will be described.

First, the support substrate 20 is prepared. In a step of preparing the support substrate 20 (support substrate preparation step), the plurality of conductive members 22 (conductive members 22A and 22B) are bonded spaced apart from each other onto the insulating substrate 21. Then, the pair of insulating layers 23A and 23B, the pair of gate layers 24A and 24B, the pair of detection layers 25A and 25B, and the plurality of base portions 29 are bonded onto the conductive members 22A and 22B.

Figure 15:
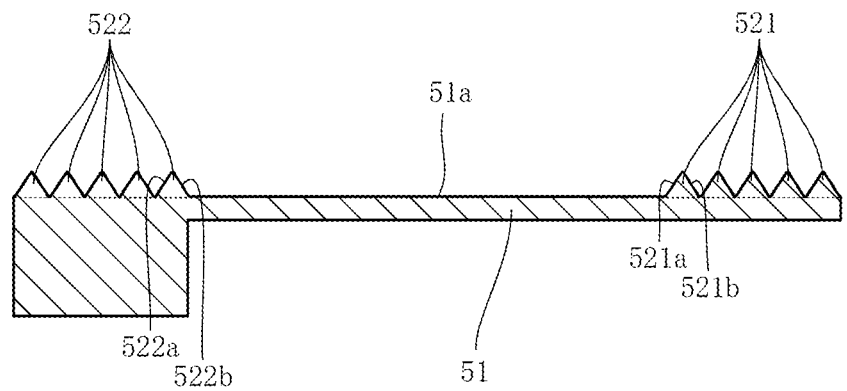
FIG. 15 is a diagram showing a step (lead preparation step) of a method for manufacturing a semiconductor device according to the first embodiment.

Next, the plurality of lead members 51 are prepared. In a step of preparing the lead members 51 (lead preparation step), the lead member 51 shown in FIG. 15 is formed by performing metal processing, such as rolling, on a metal plate whose component material is Cu or a Cu alloy. In each of the plurality of protrusions 521 of the lead member 51 after subjected to the lead preparation step, an edge in the thickness direction z2 of the side face 521a and an edge in the thickness direction z2 of the side face 521b are connected to each other, and the protrusion 521 does not include the top face 521c in the above-described semiconductor device A1, as shown in FIG. 15. Further, in each of the plurality of protrusions 522 of lead member 51 after subjected to the lead preparation step, an edge in the thickness direction z2 of the side face 522a and an edge in the thickness direction z2 of the side face 522b are connected to each other, and the protrusion 522 does not include the top face 522c in the above-described semiconductor device A1, as shown in FIG. 15. The lead preparation step corresponds to a "connecting member preparation step" of the present disclosure.

Next, a plurality of sintering metallic materials 301 are formed. Each sintering metallic material 301 is the basis of the element bonding layers 31A and 31B. In the present embodiment, sintering silver paste is used as the sintering metallic materials 301. This sintering silver paste is a mixture of a solvent and micro-sized or nano-sized silver particles. In the present embodiment, the solvent of the sintering silver does not contain (or hardly contains any) epoxy resin. In a step of forming the sintering metallic materials 301 (first sintering metallic material step), the sintering metallic materials 301 are applied to the conductive members 22A and 22B by means of screen printing, for example. Note that the sintering metallic materials 301 applied to the conductive member 22A later become the element bonding layers 31A of the semiconductor device A1, and the sintering metallic materials 301 applied to the conductive member 22B later become the element bonding layers 31B of the semiconductor device A1. The method for forming the plurality of sintering metallic materials 301 is not limited to the aforementioned screen printing. For example, the sintering metallic materials 301 may alternatively be applied using a dispenser. Each of the applied sintering metallic materials 301 has a thickness of about 100 μm.

Next, treatment for drying the plurality of sintering metallic materials 301 is performed. In a step of performing this drying treatment (drying step), the sintering metallic materials 301 are heated at a temperature of about 130° C. for about 20 minutes. Note that the heating conditions are not limited thereto. Thus, the solvent of the sintering metallic materials 301 is vaporized.

Next, one of the semiconductor elements 10A and 10B is mounted on each sintering metallic material 301. Specifically, one semiconductor element 10A is placed on each sintering metallic material 301 formed on the conductive member 22A, and one semiconductor element 10B is placed on each sintering metallic material 301 formed on the conductive member 22B. In a step of mounting the semiconductor elements 10A and 10B (mounting step), the semiconductor elements 10A are mounted on the conductive member 22A in an orientation in which the conductive member 22A opposes the element reverse faces 102 of the semiconductor elements 10A, and the semiconductor elements 10B are mounted on the conductive members 22B in an orientation in which the conductive member 22B opposes the element reverse faces 102 of the semiconductor elements 10B.

Next, sintering metallic materials 302 are formed on the plurality of semiconductor elements 10A and 10B and the conductive member 22B. The sintering metallic materials 302 are the basis of the lead bonding layers 321 and 322 and the terminal bonding layers 33. In the present embodiment, preformed sintering silver is used as the sintering metallic materials 302. This preformed sintering silver is obtained by subjecting the aforementioned sintering silver paste to drying treatment and then molding the silver paste into a predetermined shape. Note that the preformed sintering silver may be obtained by molding the aforementioned sintering silver paste into a predetermined shape and then performing the drying treatment thereon. In a step of forming the sintering metallic materials 302 (second sintering metallic material forming step), the plurality of sintering metallic materials 302 are placed on the plurality of semiconductor elements 10A and 10B and the conductive member 22B in one-to-one correspondence. Note that the sintering metallic materials 302 formed on the semiconductor elements 10A later become the lead bonding layers 321 of the semiconductor device A1, and the sintering metallic materials 302 formed on the conductive member 22B later become the lead bonding layers 322 of the semiconductor device A1. The sintering metallic materials 302 formed on the semiconductor elements 10B later become the terminal bonding layers 33 of the semiconductor device A1. The thickness of the sintering metallic materials 302 placed is about 110 μm. In the present embodiment, the second sintering metallic material forming step corresponds to a "sintering metallic material forming step" of the present disclosure.

Next, the semiconductor elements 10A and the conductive member 22B are connected to each other using the lead members 51 prepared in the above lead preparation step. In this step of connection using the lead members 51 (connecting step), the lead members 51 are placed on the sintering metallic materials 302 so that the plurality of protrusions 521 overlap with the sintering metallic materials 302 formed on the semiconductor elements 10A, and that the protrusions 522 overlap with the sintering metallic materials 302 formed on the conductive member 22B, in a plan view.

Next, the plurality of terminals 40 are bonded. When the input terminal 41 is bonded, the comb-toothed portions 411a are bonded to the obverse face 221A of the conductive member 22A. This bonding may be bonding using laser welding, or may be ultrasonic bonding. When the output terminal 43 is bonded, the comb-toothed portions 431a are bonded to the obverse face 221B of the conductive member 22B. This bonding may be bonding using laser welding, or may be ultrasonic bonding. When the input terminal 42 is bonded, the input terminal 42 is bonded above the input terminal 41 with the insulating member 49 inserted therebetween. Here, the edge portions of the plurality of extending portions 421b of the input terminal 42 overlap with the semiconductor elements 10B in a plan view. Also, the plurality of protruding portions 421c of the input terminal 42 come into contact with the sintering metallic materials 302 formed on the conductive member 22B. The pair of gate terminals 44A and 44B, the pair of detection terminals 45A and 45B, the plurality of dummy terminals 46, and the pair of side terminals 47A and 47B are formed on one lead frame and are connected to each other. Then, portions of the lead frame that correspond to the side terminals 47A and 47B are bonded to the obverse face 221A of the conductive member 22A and the obverse face 221B of the conductive member 22B, respectively. This bonding may be bonding using laser welding, or may be ultrasonic bonding.

Figure 16:
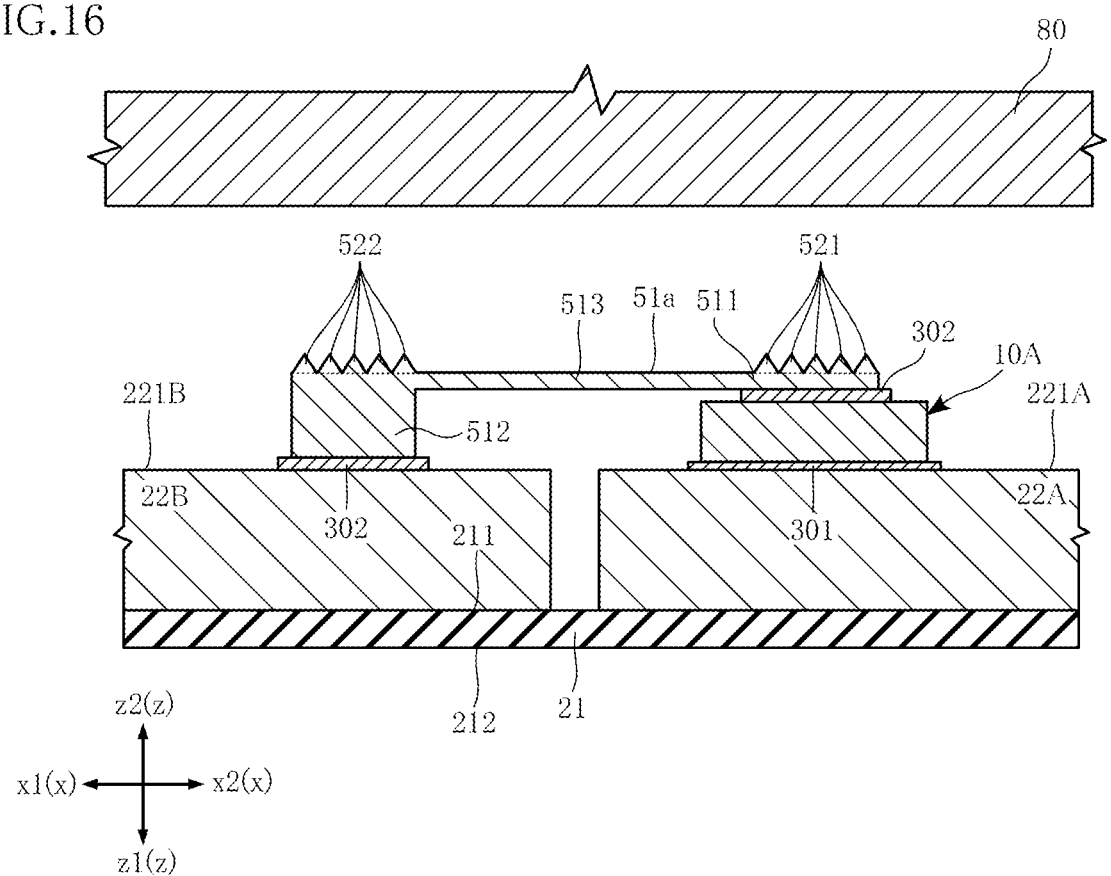
FIG. 16 is a diagram showing a step (pressure heating step) of the method for manufacturing a semiconductor device according to the first embodiment.
Figure 17:
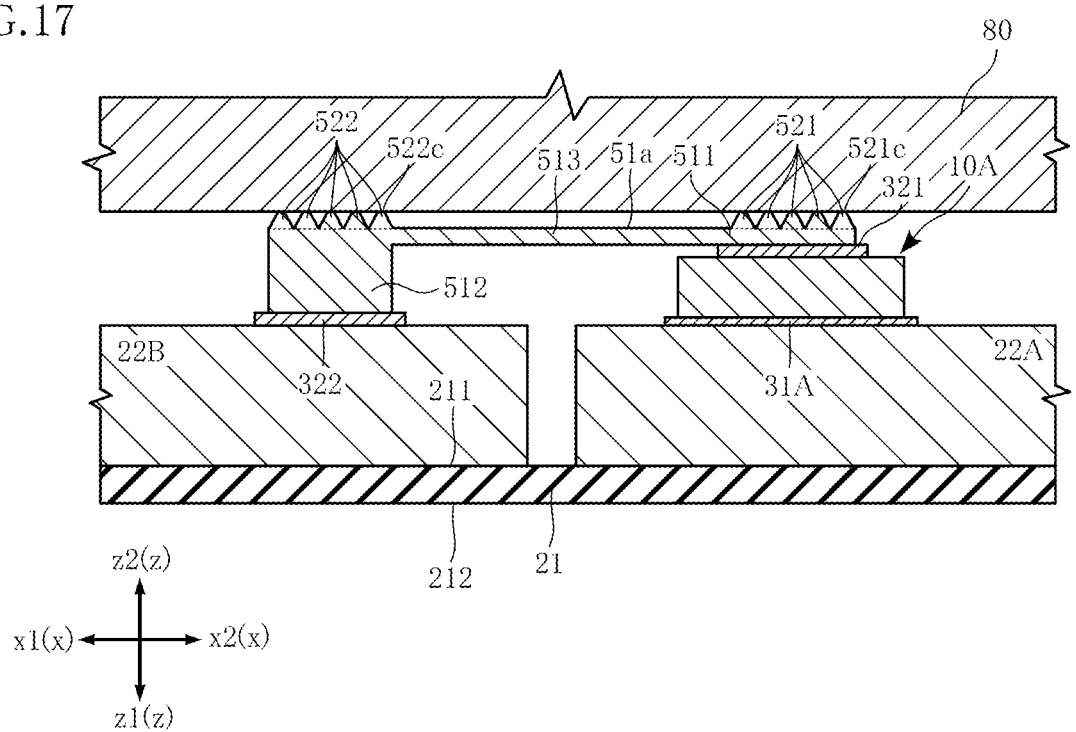
FIG. 17 is a diagram showing a step (pressure heating step) of the method for manufacturing a semiconductor device according to the first embodiment.

Next, pressure-heating treatment for making the sintering metallic materials 301 and 302 into sintered metal is performed. In this step of performing the pressure-heating treatment (pressure heating step), pressure is applied to the plurality of sintering metallic materials 301 and 302 by pressing the lead members 51 using a pressing member 80, as shown in FIGS. 16 and 17. Here, the pressing member 80 comes into contact with the plurality of protrusions 521 and 522 of each lead member 51. Then, the leading ends of the protrusions 521 and 522 are crushed by the pressing force applied by the pressing member 80, and the top faces 521c and 522c are formed. Also, pressure is applied to the sintering metallic materials 302 by pressing the input terminal 42 using the pressing member 80, or using a pressing member other than the pressing member 80. Then, the sintering metallic materials 301 and 302 that are pressed via the lead members 51 and the sintering metallic materials 302 that is pressed via the input terminal 42 are heated at a temperature of about 250° C. for about 90 seconds, for example. Note that the heating conditions are not limited thereto. As a result, silver particles are bonded to each other in the plurality of sintering metallic materials 301 and 302, which then become sintered metals. Note that the sintered metals disposed between the semiconductor elements 10A and the conductive member 22A are the element bonding layers 31A of the semiconductor device A1, and the sintered metals disposed between the semiconductor elements 10B and the conductive member 22B are the element bonding layers 31B of the semiconductor device A1. The sintered metals disposed between the lead members 51 and the semiconductor elements 10A are the lead bonding layers 321 of the semiconductor device A1, and the sintered metals disposed between the lead members 51 and the conductive member 22B are the lead bonding layers 322 of the semiconductor device A1. The sintered metals disposed between the semiconductor element 10B and the input terminal 42 (pad portion 421) are the terminal bonding layers 33 of the semiconductor device A1.

Next, the plurality of wire members 6 are formed. In a step of forming the wire members 6 (wire forming step), a well-known wire bonder is used, for example. In the wire forming step, the plurality of gate wires 61 that connect the second electrodes 112 of the semiconductor elements 10A and the gate layer 24A to each other, and the plurality of gate wires 61 that connect the second electrodes 112 of the semiconductor elements 10B and the gate layer 24B to each other, are formed. Also, the plurality of detection wires 62 that connect the first electrodes 111 of the semiconductor elements 10A and the detection layer 25A to each other, and the plurality of detection wires 62 that connect the first electrodes 111 of the semiconductor elements 10B and the detection layer 25B to each other, are formed. Furthermore, the first connection wire 63 that connects the gate layer 24A and the gate terminal 44A to each other and the first connection wire 63 that connects the gate layer 24B and the gate terminal 44B to each other are formed. Also, the second connection wire 64 that connects the detection layer 25A and the detection terminal 45A to each other and the second connection wire 64 that connects the detection layer 25B and the detection terminal 45B to each other are formed. Note that the order of forming the plurality of wire members 6 is not specifically limited.

Next, the sealing resin 7 is formed. A step of forming the sealing resin 7 (resin forming step) is performed by means of transfer molding, for example. The sealing resin 7 is made of epoxy resin, for example. In the present embodiment, the sealing resin 7 is formed so as to cover the plurality of semiconductor elements 10, a portion of the support substrate 20, the plurality of conductive bonding layers 3, a portion of each of the plurality of terminals 40, the plurality of lead members 51, and the plurality of wire members 6. A portion of each terminal 40 and a portion of the support substrate 20 (specifically, the reverse face 212 of the insulating substrate 21) are exposed from the formed sealing resin 7.

Thereafter, unnecessary portions (e.g., portions of the aforementioned lead frame) of the plurality of terminals 40 are cut and the plurality of terminals 40 are bent, and thus the semiconductor device A1 shown in FIGS. 1 to 14 is manufactured. Note that the above-described manufacturing method is an example, and the present invention is not limited thereto. The order may be changed as appropriate.

Next, advantages of the semiconductor device A1 and the method for manufacturing the semiconductor device A1 according to the first embodiment will be described.

According to the semiconductor device A1, the lead members 51, each of which has the lead obverse face 51a, are provided. Each lead member 51 has the protrusions 521 that protrude in the thickness direction z2 from the lead obverse face 51a. In the pressure heating step in the method for manufacturing the semiconductor device A1, the sintering metallic materials 302 formed on the semiconductor elements 10A are pressed by pressing the lead members 51 using the pressing member 80. Here, the pressing member 80 comes into contact with the plurality of protrusions 521 formed on the lead obverse face 51a and presses each lead member 51. Accordingly, the pressing member 80 does not come into contact with the connecting portion 513. Accordingly, the pressing force applied by the pressing member 80 can be concentrated on the first bonding portion 511. That is to say, the pressing force applied by the pressing member 80 can be transmitted to the sintering metallic materials 301 formed below the plurality of protrusions 521 to suppress the pressure applied to the connecting portion 513. Thus, bending of the connecting portion 513 can be suppressed. Accordingly, the semiconductor device A1 can suppress deformation of each lead member 51.

According to the semiconductor device A1, the sintering metallic materials 301 formed below the semiconductor elements 10A and the sintering metallic materials 302 formed on the semiconductor elements 10A are simultaneously subjected to the pressure-heating treatment. That is to say, the element bonding layers 31A and the lead bonding layers 321 are simultaneously subjected to the sintering treatment. Accordingly, the element bonding layers 31A and the lead bonding layers 321 are formed from these sintering metallic materials 301 and 302 by performing the pressure-heating treatment once, and therefore, the productivity of the semiconductor device A1 can be increased.

According to the semiconductor device A1, each lead member 51 has protrusions 522 that protrude in the thickness direction z2 from the lead obverse face 51a. Thus, when pressure is applied by the pressing member 80, the pressing member 80 comes into contact with the plurality of protrusions 522, and thus, the pressing force applied by the pressing member 80 is transmitted to the sintering metallic materials 302 formed below the plurality of protrusion 522. Accordingly, the pressing force applied by the pressing member 80 can be concentrated on the sintering metallic materials 302 formed on the conductive member 22B. Furthermore, as a result of the plurality of protrusions 522 being formed, the pressing force can be simultaneously transmitted to the sintering metallic materials 302 formed below the plurality of protrusions 521 and 522 by applying pressing once using the pressing member 80. Accordingly, the sintering metallic materials 302 can be subjected to the sintering treatment to form the lead bonding layers 321 and 322 by performing the pressure-heating treatment once.

According to the semiconductor device A1, the plurality of protrusions 521 and 522 are formed, and the lead obverse face 51a is partially uneven due to the plurality of protrusions 521 and 522. Furthermore, the lead obverse face 51a is in contact with the sealing resin 7. Accordingly, the adhesion between the lead members 51 and the sealing resin 7 can be increased by the anchor effect. In addition, the surface area of each lead member 51 can be increased by the plurality of protrusions 521 and 522. Accordingly, heat dissipation can be increased.

Figure 18:
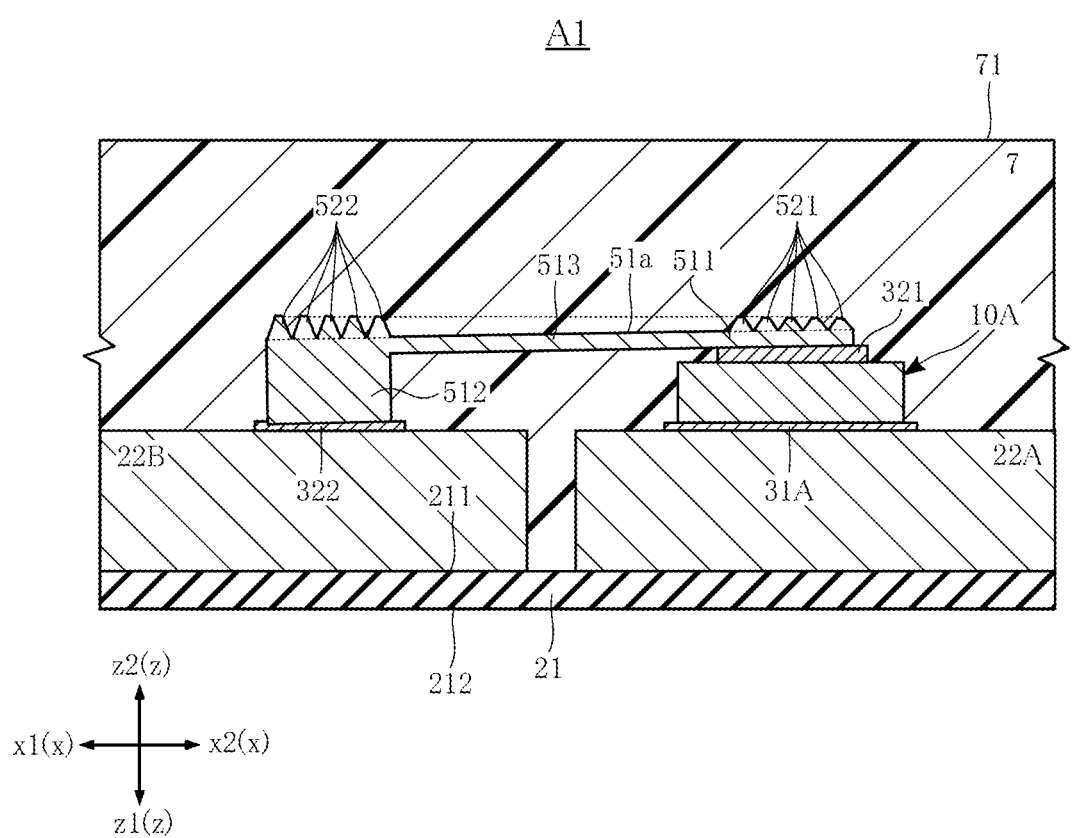
FIG. 18 is an enlarged view of a main part showing a lead member according to a variation.

According to the semiconductor device A1, the plurality of protrusions 521 and 522 are formed in each of the plurality of lead members 51. In the method for manufacturing the semiconductor device A1, when each lead member 51 is placed in the connecting step, the lead member 51 may be inclined due to an error occurring when each member is manufactured or an error occurring when the semiconductor device A1 is manufactured. In this case, if each lead member 51 does not have the plurality of protrusions 521 and 522, the pressing force concentrates only on one side of the lead member 51 during the pressing in the pressure heating step, and it may not be possible to apply an appropriate pressing force to the other side. Consequently, the pressing force is not sufficiently applied to either the sintering metallic materials 301 or 302, causing a decrease in the bonding strength of the conductive bonding layers 3. On the other hand, if the plurality of protrusions 521 and 522 are provided in each lead member 51 as in the present embodiment, the amount by which the plurality of protrusions 521 and 522 are crushed changes as shown in FIG. 18. Note that the example in FIG. 18 shows the case where, of each protrusion 521, the length in the thickness direction z of the side face 521b is smaller than the length in the thickness direction z of the side face 521a, and, of two adjacent protrusions 521, the length in the thickness direction z of the side face 521a of the protrusion 521 located in the width direction x2 is smaller than the length in the thickness direction z of the side face 521b of the protrusion 521 located in the width direction x1. Note that the same applies to the protrusions 522. The top face 521c of each protrusion 521 and the top face 522c of each protrusion 522 are located in the same plane. In this case as well, appropriate pressing force can be applied to both the first bonding portion 511 and the second bonding portion 512 of each lead member 51, and therefore, appropriate pressing force can be applied to both the plurality of sintering metallic materials 301 and 302. Accordingly, insufficient pressing of the plurality of sintering metallic materials 301 and 302 can be suppressed, and a decrease in the bonding strength of the conductive bonding layers 3 can be suppressed.

In particular, research by the inventor of the present application revealed that a change in the contact pressure with respect to the amount by which the protrusions 521 and 522 are crushed by the pressing member 80 is small if both the angels α and β are about 90°, both the widths $W_{521}$ and $W_{522}$ are about 0.67 μm, and both the heights $H_{521}$ and $H_{522}$ are about 0.33 μm. Accordingly, by making the protrusions 521 and 522 have the above-described lengths, the variation in the degree of pressing of each lead member 51 can be suppressed even if the amounts by which the plurality of protrusions 521 and 522 of the lead member 51 are crushed differ.

Although the above example has described the case where each lead member 51 is inclined, this need not be the case, and the same applies to the case where there is a variation in height between the plurality of lead members 51. That is to say, if the height varies between the plurality of lead members 51, even if the amount by which the protrusions 521 and 522 are crushed by the pressing member 80 differs between the plurality of lead members 51, appropriate pressing force can be applied to the plurality of sintering metallic materials 301 and 302 for each of the plurality of lead members 51. In the semiconductor device that may be manufactured in this case, the heights $H_{521}$ and $H_{522}$ of the protrusions 521 and 522 differ between the plurality of lead members 51.

According to the semiconductor device A1, the element bonding layers 31A and 31B are formed from the sintering metallic materials 301 that are sintering silver paste. Sintering silver paste is cheaper than preformed sintering silver. Accordingly, the manufacturing cost of the semiconductor device A1 can be suppressed. Note that in the present embodiment, the element bonding layers 31A and 31B may alternatively be formed from preformed sintering silver. That is to say, preformed sintering silver may alternatively be used as the sintering metallic materials 301. In this case, the manufacturing cost of the semiconductor device A1 increases, but the aforementioned drying step is unnecessary, and thus the productivity can be increased.

The semiconductor device according to other embodiments will be described below. Note that in the following description, elements that are the same as or similar to those of the first embodiment are assigned the same reference signs, and description thereof is omitted.

FIGS. 19 to 23 show a semiconductor device according to the second embodiment. A semiconductor device A2 according to the second embodiment differs from the semiconductor device A1 in the method for connecting the input terminal 42 to the semiconductor elements 10B. Specifically, in the semiconductor device A1, the pad portion 421 of the input terminal 42 is conductively bonded to each semiconductor element 10B via the terminal bonding layer 33, whereas, in the present embodiment, the pad portion 421 of the input terminal 42 and each semiconductor element 10B are connected to each other by a lead member 53, which differs from the lead member 51.

Figure 19:
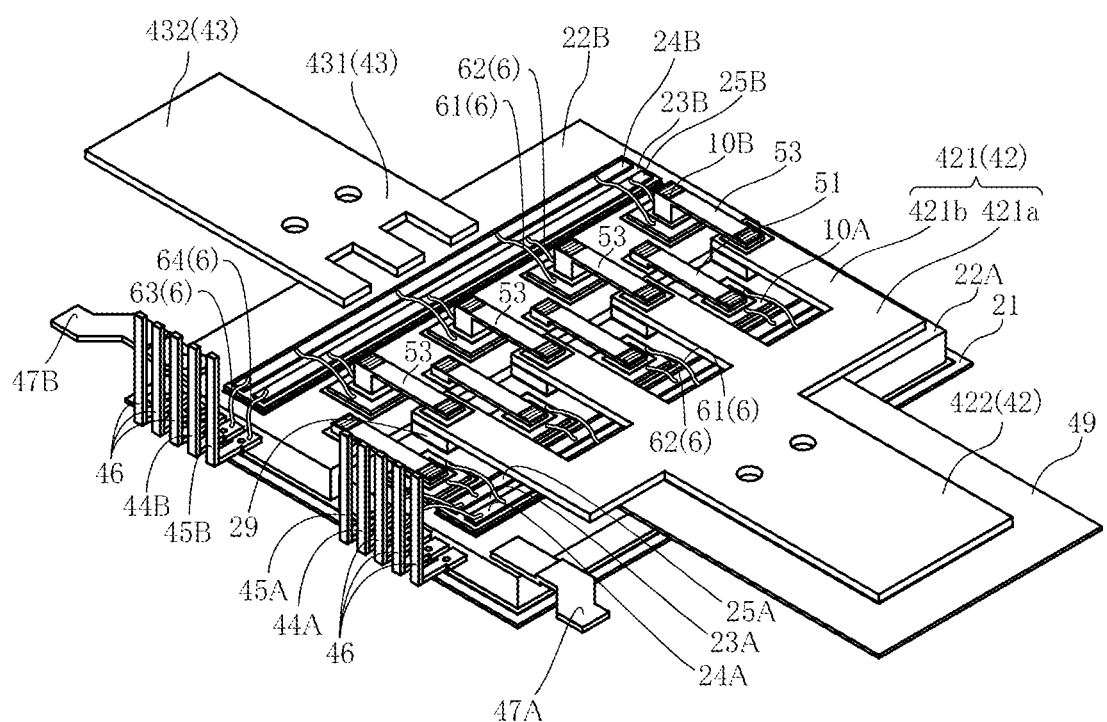
FIG. 19 is a perspective view showing a semiconductor device according to a second embodiment.
Figure 19:
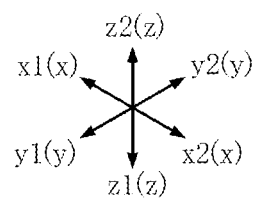
Figure 20:
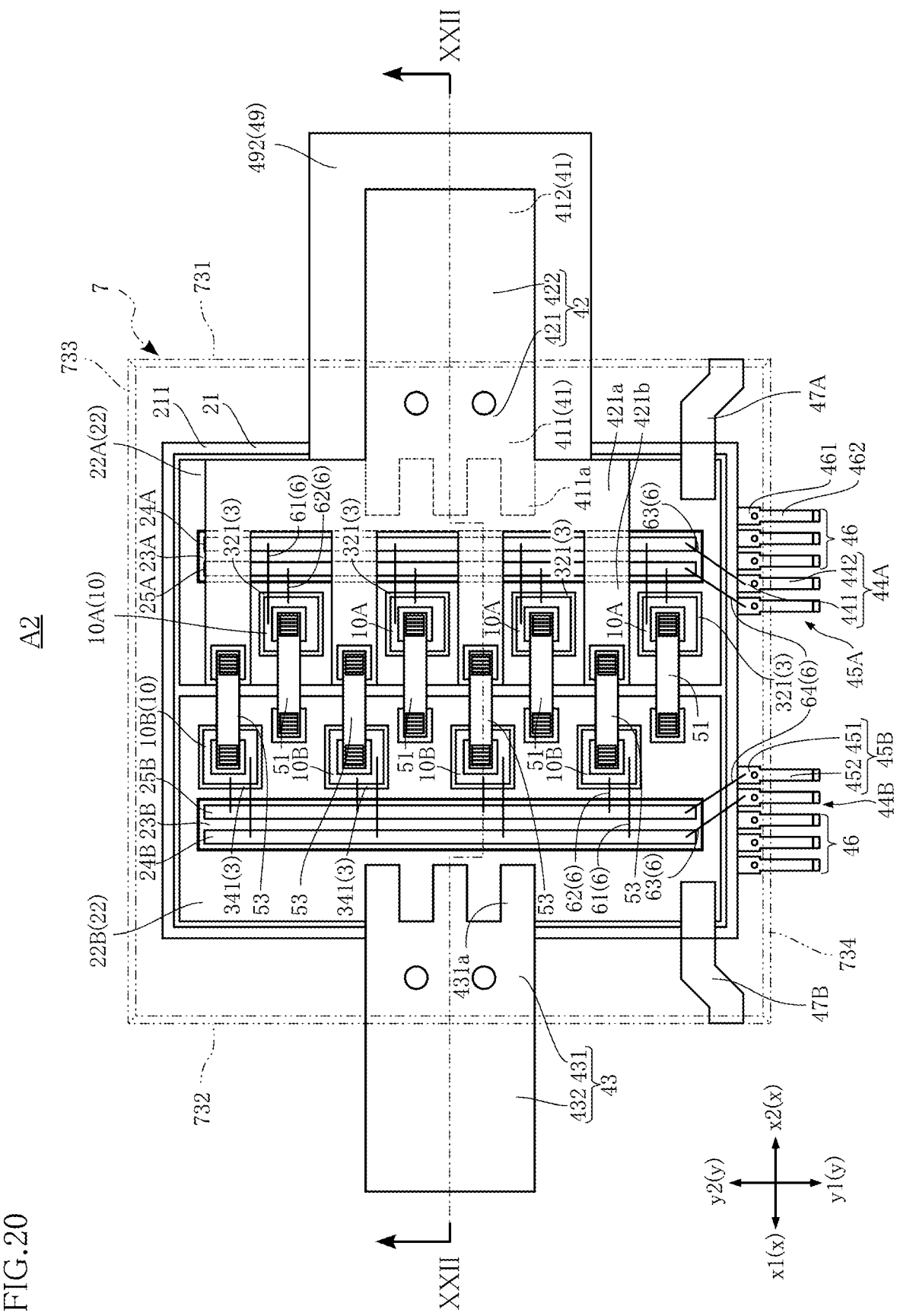
FIG. 20 is a plan view showing the semiconductor device according to the second embodiment.
Figure 21:
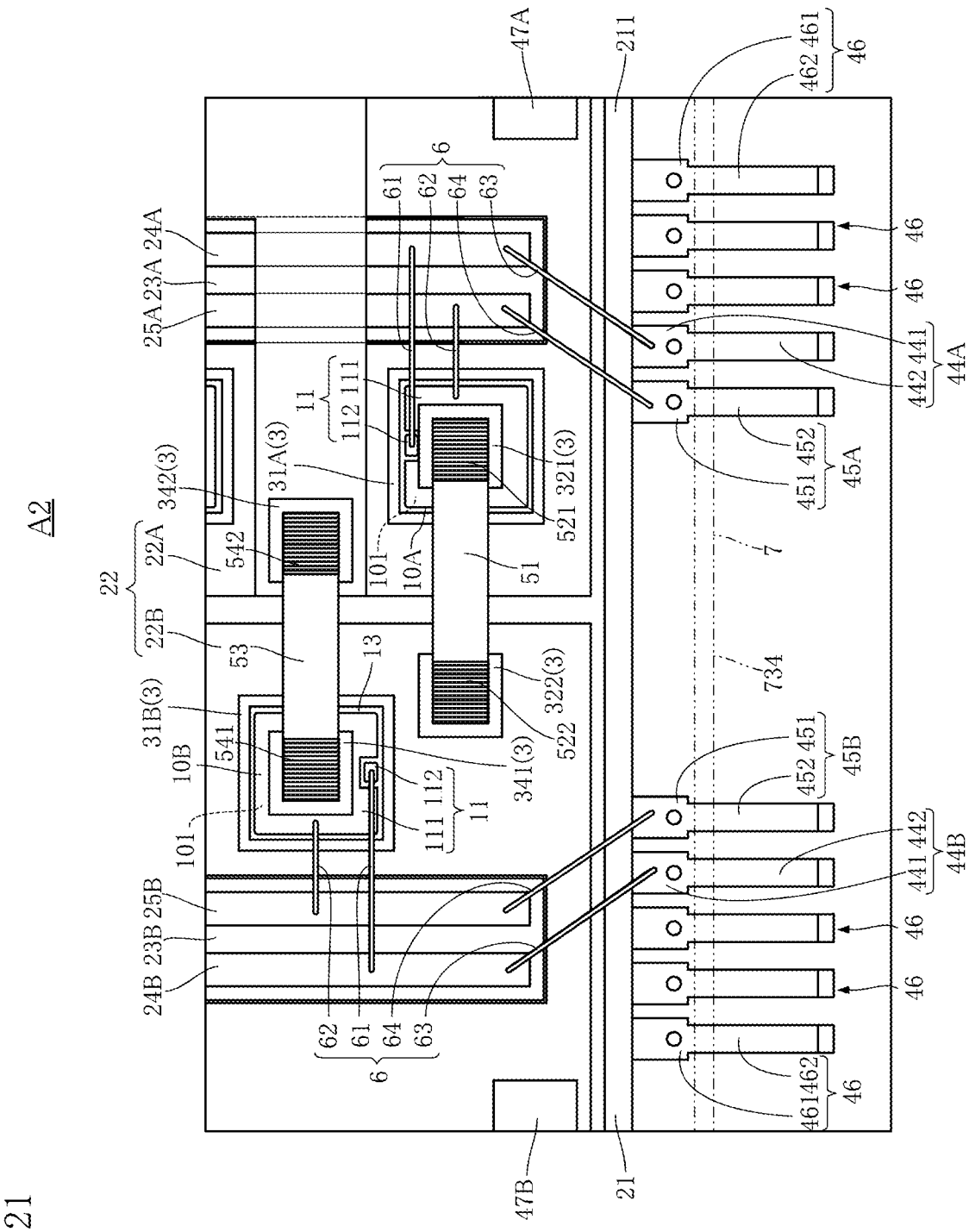
FIG. 21 is a partially enlarged view in which a portion of FIG. 20 is enlarged.
Figure 22:
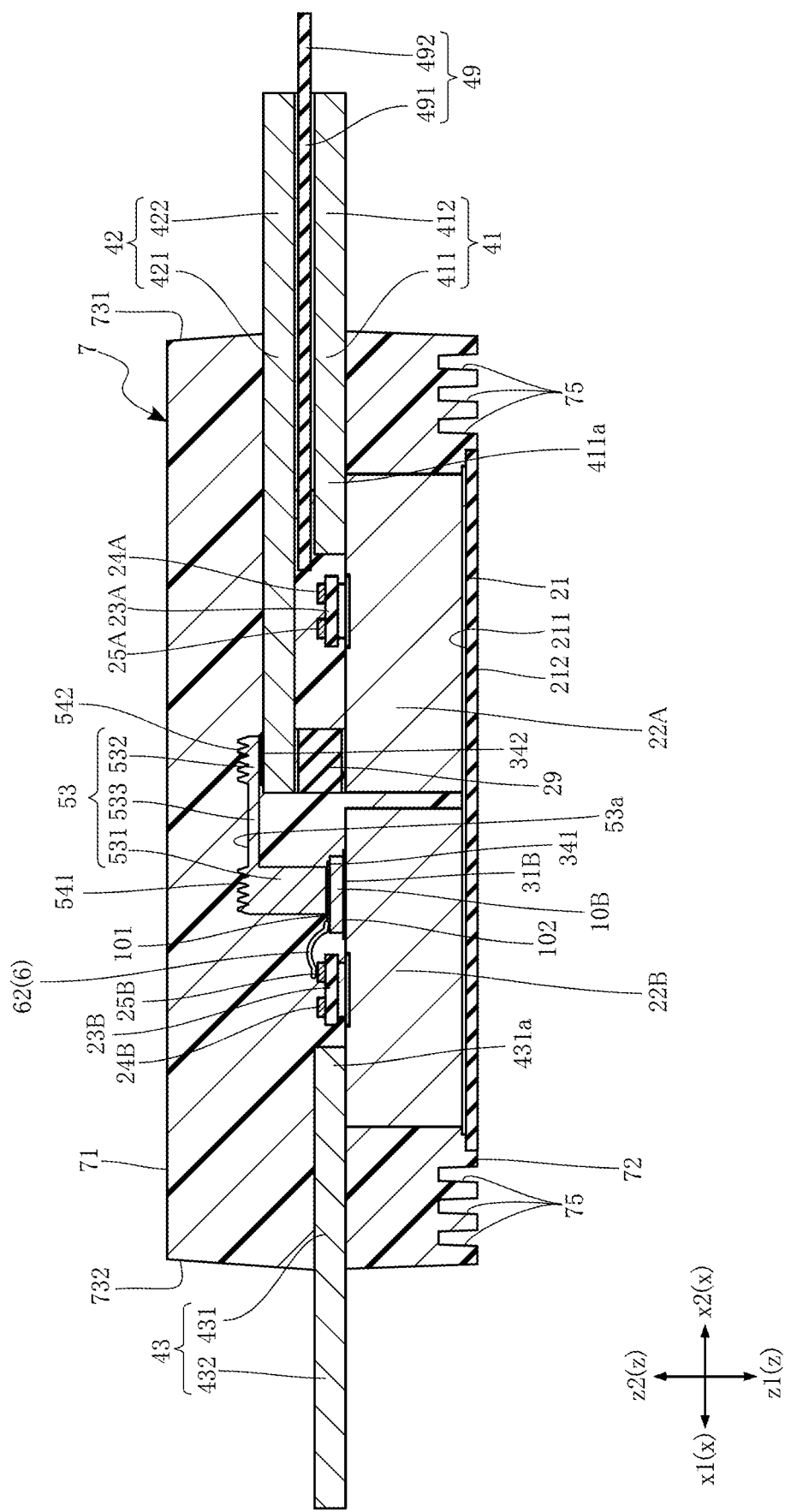
FIG. 22 is a cross-sectional view of FIG. 20 taken along a line XXII-XXII.
Figure 23:
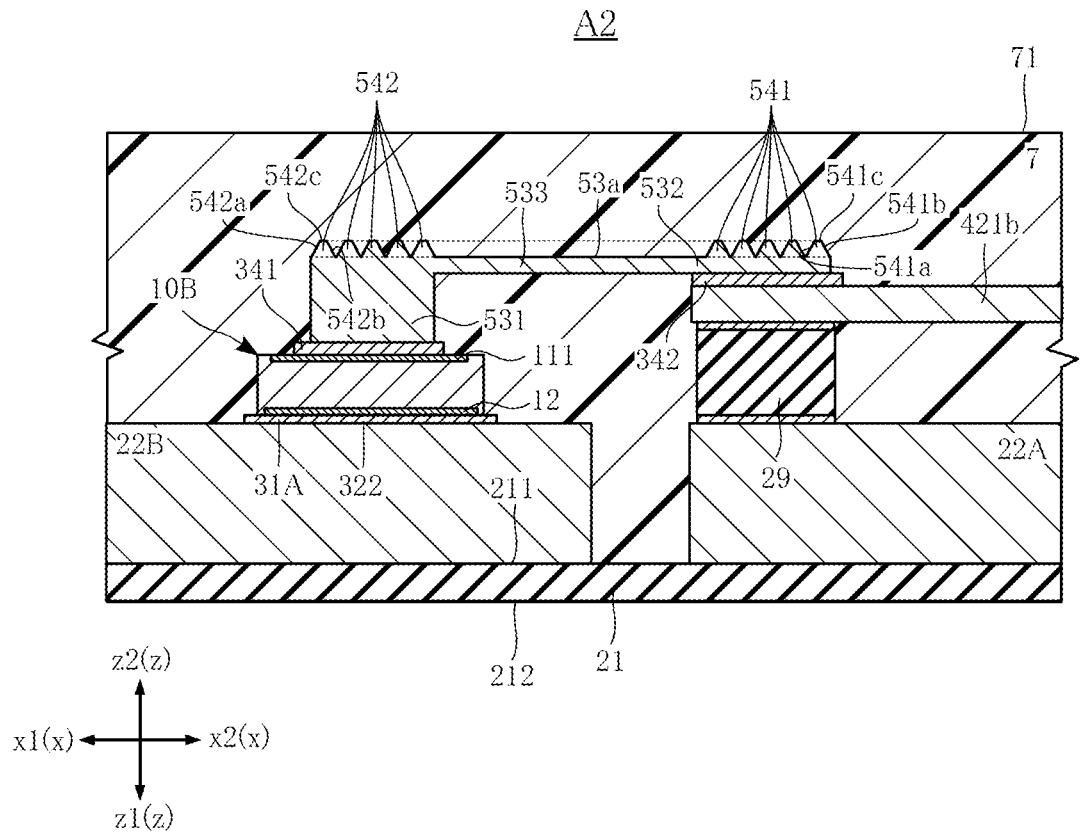
FIG. 23 is a partially enlarged view in which a portion of FIG. 22 is enlarged.

FIG. 19 is a perspective view showing the semiconductor device A2. FIG. 20 is a plan view showing the semiconductor device A2, where the sealing resin 7 is indicated by an imaginary line (dash-double dot line). FIG. 21 is a partially enlarged view in which a portion of FIG. 20 is enlarged. FIG. 22 is a cross-sectional view of FIG. 20 taken along a line XXII-XXII. FIG. 23 is a partially enlarged view in which a portion of FIG. 22 is enlarged.

In the present embodiment, the conductive bonding layers 3 include a plurality of element bonding layers 31A and 31B and a plurality of lead bonding layers 321, 322, 341, and 342. Accordingly, compared with the conductive bonding layers 3 of the first embodiment, the conductive bonding layers 3 of the present embodiment do not include the terminal bonding layers 33, but further include the lead bonding layers 341 and 342.

The plurality of lead bonding layers 341 and 342 are for bonding the lead members 53.

The plurality of lead bonding layers 341 are for bonding a portion of each lead member 53 to the corresponding semiconductor element 10B. Each lead bonding layer 341 is disposed between the element obverse face 101 of the corresponding semiconductor element 10B and a portion (later-described first bonding portion 531) of the corresponding lead member 53, and electrically connects the obverse-face electrode 11 (first electrode 111) of the semiconductor element 10B and the lead member 53 to each other. Each lead bonding layers 341 has a thickness of about 80 μm. Note that the thickness of each lead bonding layer 341 is not limited thereto.

The plurality of lead bonding layers 342 are for bonding a portion of each lead member 53 to the input terminal 42. Each lead bonding layer 342 is disposed between a portion (later-described second bonding portion 532) of the corresponding lead member 53 and the corresponding extending portion 421b of the input terminal 42, and electrically connects the lead member 53 and the input terminal 42 to each other. Each lead bonding layers 342 has a thickness of about 80 μm. Note that the thickness of each lead bonding layer 342 is not limited thereto.

In the present embodiment, the pad portion 421 of the input terminal 42 does not include the plurality of protruding portions 421c, and the plurality extending portions 421b do not overlap with the conductive member 22B in a plan view. In the present embodiment, the extending portions 421b extend in the width direction x from the connecting portion 421a until they overlap with the respective base portions 29 in a plan view. Note that in the present embodiment, the respective base portions 29 need to be provided in order to support the extending portions 421b of the pad portion 421 of the input terminal 42.

The plurality of lead members 53 are for connecting the semiconductor elements 10B and the input terminal 42 to each other. Each lead member 53 has a rectangular shape extending in the width direction x in a plan view. Each lead member 53 includes a first bonding portion 531, a second bonding portion 532, and a connecting portion 533.

The first bonding portion 531 is a portion that is bonded to the obverse-face electrode 11 (first electrode 111) of the corresponding semiconductor element 10B via the conductive bonding layer 3 (lead bonding layer 341). The first bonding layer 531 overlaps with the first electrode 111 of the semiconductor element 10B, the lead bonding layer 341, and the semiconductor element 10B in a plan view. The thickness of the first bonding portion 531 is greater than the thickness of the second bonding portion 532.

The second bonding portion 532 is a portion that is bonded to the corresponding extending portion 421b of the input terminal 42 via the conductive bonding layer 3 (lead bonding layer 342). The second bonding portion 532 overlaps with the lead bonding layer 342 in a plan view. The thickness of the second bonding portion 532 is smaller than the thickness of the first bonding portion 531. In the present embodiment, the second bonding portion 532 has a thickness of about 160 to 200 μm. Note that the thickness of the second bonding portion 532 is not limited thereto.

The connecting portion 533 is a portion connected to the first bonding portion 531 and the second bonding portion 532. A face of the connecting portion 533 that faces in the thickness direction z2 is in contact with the sealing resin 7. The thickness of the connecting portion 533 is the same as the thickness of the second bonding portion 532. Accordingly, in the present embodiment, the thickness of the connecting portion 533 is about 160 to 200 μm. Note that the thickness of the connecting portion 533 is not limited thereto. The connecting portion 533 overlaps with the second bonding portion 532 as viewed in the width direction x.

Each lead member 53 has a lead obverse face 53a. The lead obverse face 53a faces in the thickness direction z2. In the present embodiment, the lead obverse face 53a is substantially flat. The lead obverse face 53a includes faces of the first bonding portion 531, the second bonding portion 532, and the connecting portion 533 that face in the thickness direction z2.

Each lead member 53 includes a plurality of protrusions 541 and a plurality of protrusions 542 that protrude in the thickness direction z from the lead obverse face 53a. Each of the plurality of protrusions 541 and 542 extends in the depth direction y in a plan view, and has a trapezoidal shape as viewed in the depth direction y. The plurality of protrusions 541 and 542 may be formed so as to be the same as the plurality of protrusions 521 and 522 of each lead member 51. For example, the plurality of protrusions 541 and 542 may be formed by means of metalworking (e.g., rolling) using a roller.

The plurality of protrusions 541 overlap with the lead bonding layer 341, the first electrode 111 of the semiconductor element 10B and the element bonding layer 31B in a plan view. The plurality of protrusions 541 are formed in the first bonding portion 531. Each protrusion 541 has a length in the width direction x (width) of about 0.4 to 0.67 μm, and a length in the thickness direction z (height) of about 0.14 to 0.43 μm. Each protrusion 541 includes a pair of side faces 541a and 541b and a top face 541c.

The pair of side faces 541a and 541b are formed so as to rise from the lead obverse face 53a. In the present embodiment, the side faces 541a and 541b are inclined with respect to the lead obverse face 53a. In the present embodiment, the angle formed by the pair of side faces 541a and 541b is about 60 to 120°. Note that this angle is not limited thereto, and may alternatively be an acute angle, for example. The pair of side faces 541a and 541b are spaced apart from each other in the width direction x, and face toward opposite sides.

The top face 541c is connected to the pair of side faces 541a and 541b. The top face 541c faces in the same direction as the lead obverse face 53a does. The top face 541c is flat. In the present embodiment, the top faces 541c of the protrusions 541 are located in one plane.

The plurality of protrusions 542 overlap with the lead bonding layer 342 in a plan view. The plurality of protrusions 542 are formed in the second bonding portion 532. Each protrusion 542 has a length in the width direction x (width) of about 0.4 to 0.67 μm, and a length in the thickness direction z (height) of about 0.14 to 0.43 μm. Each protrusion 542 includes a pair of side faces 542a and 542b and a top face 542c.

The pair of side faces 542a and 542b are formed so as to rise from the lead obverse face 53a. In the present embodiment, the side faces 542a and 542b are inclined with respect to the lead obverse face 53a. In the present embodiment, the angle formed by the pair of side faces 542a and 542b is about 60 to 120°. Note that this angle is not limited thereto, and may alternatively be an acute angle, for example. The pair of side faces 542a and 542b are spaced apart from each other in the width direction x, and face toward opposite sides.

The top face 542c is connected to the pair of side faces 542a and 542b. In the present embodiment, the top face 542c faces in the same direction as the lead obverse face 53a does. The top face 542c is flat. In the present embodiment, the top faces 542c of the protrusions 542 are located in one plane.

Next, advantages of the semiconductor device A2 according to the second embodiment will be described.

According to the semiconductor device A2, the lead members 51, each of which has the protrusions 521, are provided, similarly to the semiconductor device A1. Accordingly, the semiconductor device A2 can suppress deformation of each lead member 51, similarly to the semiconductor device A1 of the first embodiment. Note that other elements of the semiconductor device A2 that have the same configuration as those of the semiconductor device A1 can exhibit the same advantages as those of the semiconductor device A1.

According to the semiconductor device A2, the lead members 53, each of which have the protrusions 541 and 542, are provided. According to this configuration, the pressing force applied by the pressing member 80 can be concentrated on the first bonding portion 531 and the second bonding portion 532 to suppress the pressure applied to the connecting portion 533, similarly to the lead members 51. Accordingly, the semiconductor device A2 can suppress deformation of each lead member 53.

Figure 24:
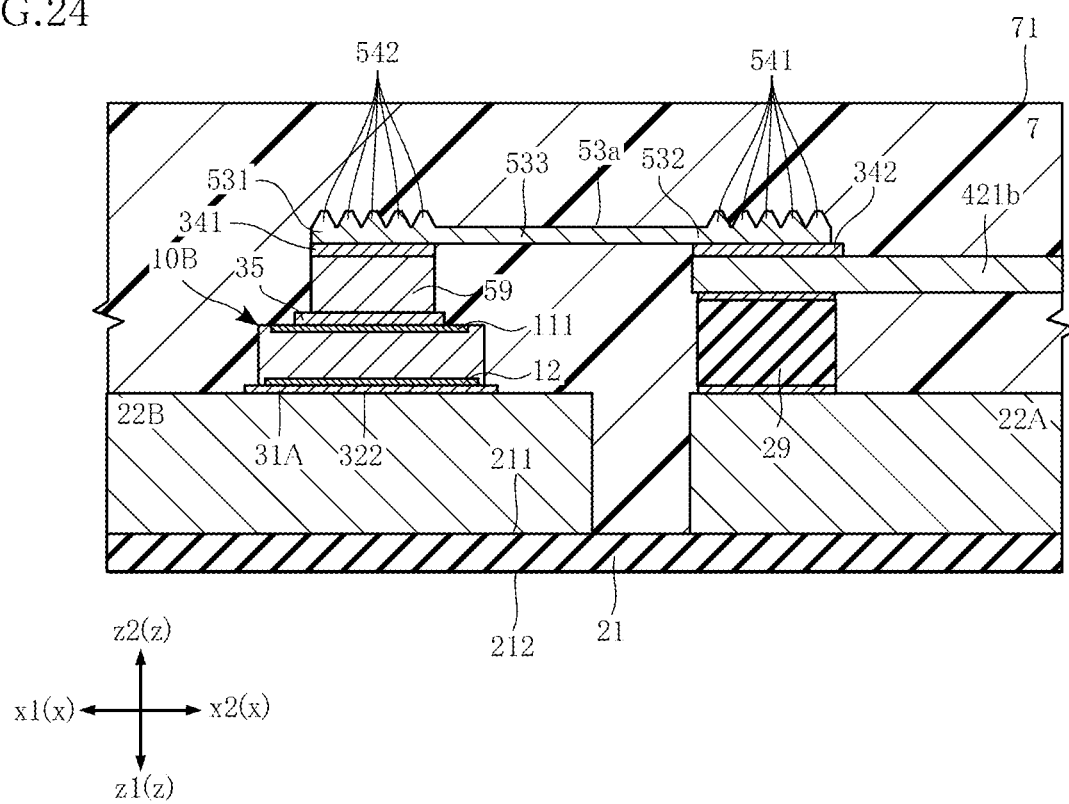
FIG. 24 is an enlarged cross-sectional view of a main part of a semiconductor device according to a variation of the second embodiment.
Figure 25:
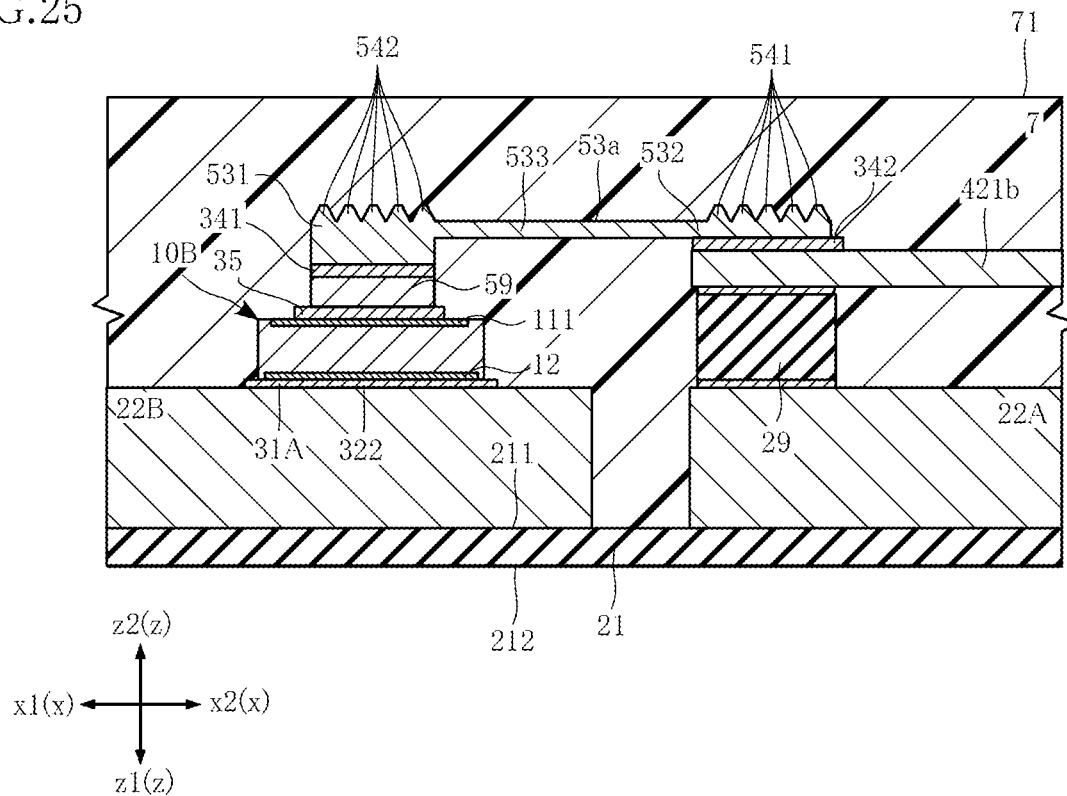
FIG. 25 is an enlarged cross-sectional view of a main part of a semiconductor device according to a variation of the second embodiment.

The second embodiment has described the case where, in each lead member 53, the difference in height between the upper face of the input terminal 41 and the element obverse face 101 of each semiconductor element 10B is eliminated by increasing the length in the thickness direction z of the first bonding portion 531, but the present invention is not limited thereto. For example, this difference in height may alternatively be eliminated using a columnar conductor 59 such as that shown in FIGS. 24 and 25. FIGS. 24 and 25 is an enlarged view of a main part showing semiconductor devices according to such variations. FIG. 24 shows the case where the first bonding portion 531 has the same thickness as that of the second bonding portion 532. FIG. 25 shows the case where each lead member 53 has substantially the same shape as that of each lead member 51. In these variations, the columnar conductor 59 may be a rectangular column whose shape in a plan view is a polygonal shape, or may be a circular column whose shape in a plan view is a circular shape. As shown in FIGS. 24 and 25, the columnar conductor 59 is bonded onto the semiconductor element 10B via a conductor bonding layer 35, which is included in the conductive bonding layers 3. The first bonding portion 531 of each lead member 53 is bonded to the upper side (in the thickness direction z2) of the columnar conductor 59 via the lead bonding layer 341. In these variations as well, deformation of the lead members 53 can be suppressed. Particularly, in the variation shown in FIG. 25, each lead member 51 and each lead member 53 have the same shape, and may therefore be the same parts. That is to say, the lead members 51 and the lead members 53 need not be manufactured in different shapes, and therefore, the productivity can be increased.

Figure 26:
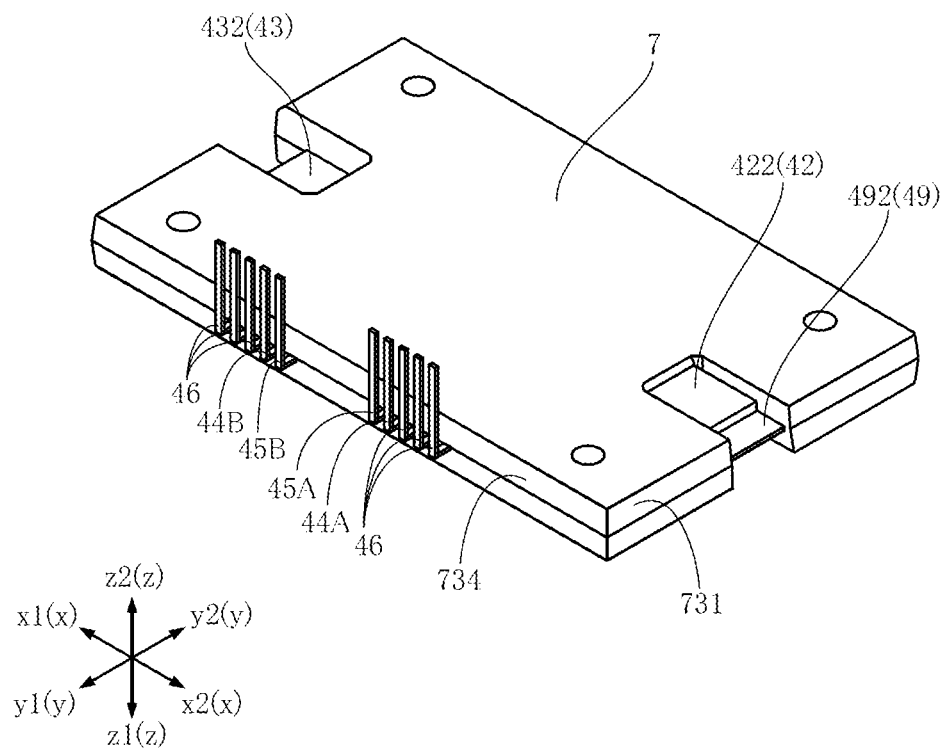
FIG. 26 is a perspective view showing a semiconductor device according to a third embodiment.

FIG. 26 shows a semiconductor device according to a third embodiment. A semiconductor device A3 of the third embodiment differs from the first and second embodiments in the shape of the sealing resin 7. Other configurations are the same as those of the above-described semiconductor devices A1 and A2. FIG. 26 is a perspective view showing the semiconductor device A3. In the present embodiment, the width direction x corresponds to a "second direction" of the present disclosure, and the depth direction y corresponds to a "third direction" of the present disclosure.

Edge portions in the depth direction y of the sealing resin 7 of the present embodiment extend in the width direction x in a plan view. The two input terminals 41 and 42 and the insulating member 49 are partially covered by the portions of the sealing resin 7 that protrude in the width direction x2. The output terminal 43 is partially covered by the portions of the sealing resin 7 that protrude in the width direction x1.

According to the semiconductor device A3, the lead members 51 each of which has the protrusions 521 are provided, similarly to the semiconductor device A1. Accordingly, the semiconductor device A3 can suppress deformation of each lead member 51, similarly to the semiconductor device A1 of the first embodiment. Note that other elements of the semiconductor device A3 that have the same configuration as those of the semiconductor device A1 can exhibit the same advantages as those of the semiconductor device A1.

According to the semiconductor device A3, for example, the two input terminals 41 and 42, the output terminal 43, and the insulating member 49, which protrude from the sealing resin 7 in the semiconductor device A1, can be partially protected.

Figure 27:
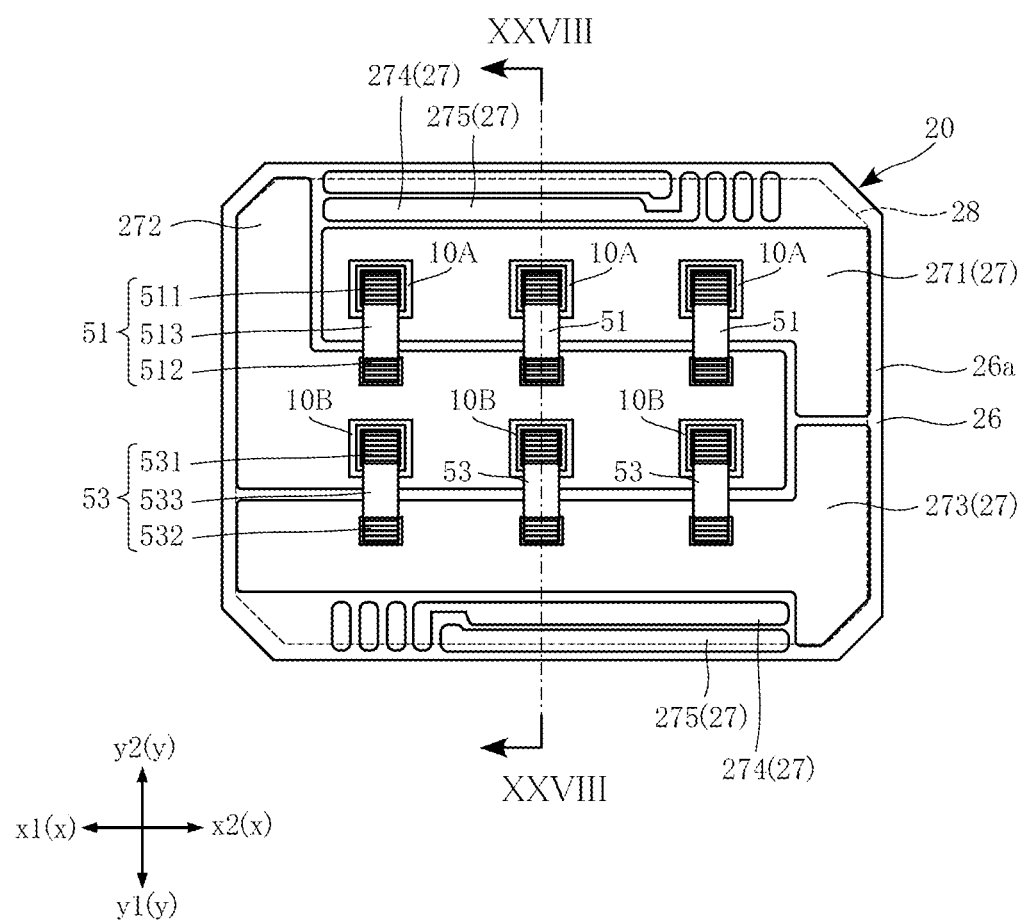
FIG. 27 is a plan view showing a semiconductor device according to a fourth embodiment.
Figure 28:
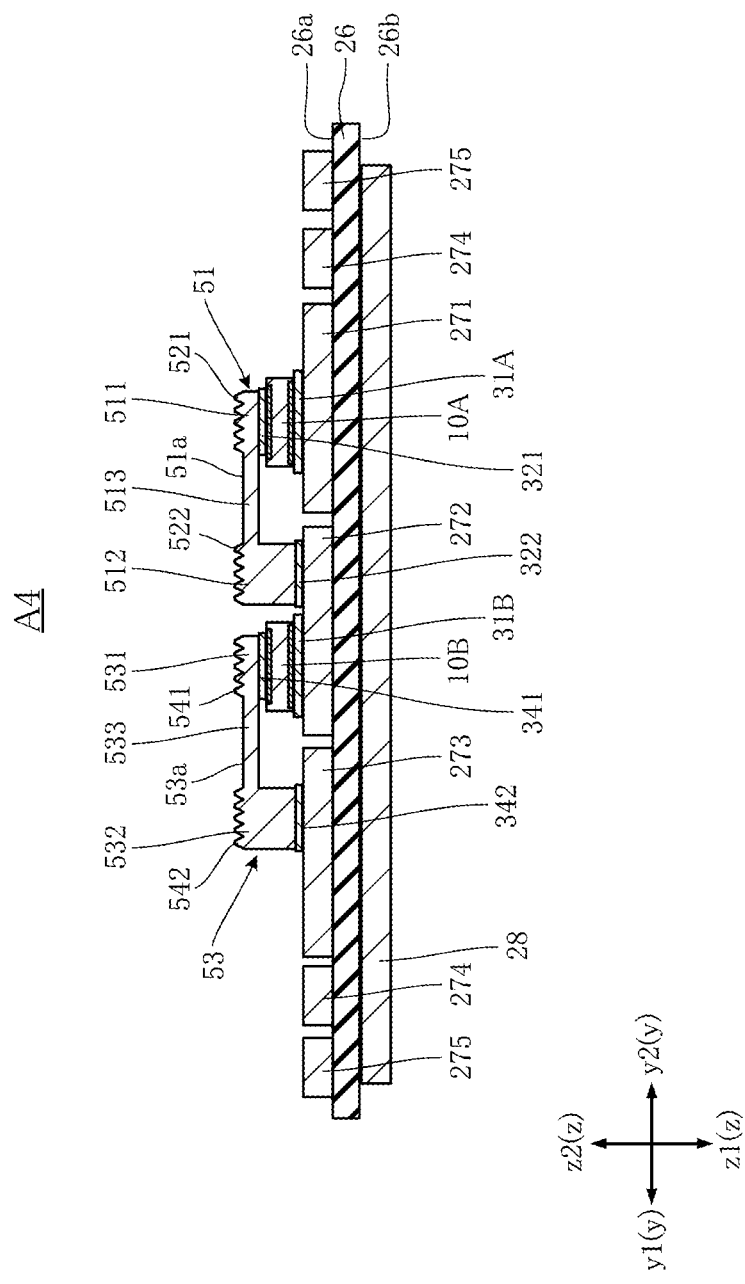
FIG. 28 is a cross-sectional view of FIG. 27 taken along a line XXVIII-XXVIII.

FIGS. 27 and 28 show a semiconductor device of the fourth embodiment. A semiconductor device A4 of the fourth embodiment differs from the first to third embodiments in the configuration of the support substrate 20. FIG. 27 is a plan view showing the semiconductor device A4, and omits the plurality of terminals 40, the plurality of wire members 6, and the sealing resin 7. FIG. 28 is a cross-sectional view of FIG. 27 taken along a line XXVIII-XXVIII.

The support substrate 20 of the present embodiment is, for example, a structure called a DBC (Direct Bonded Copper) substrate. Note that a structure called a DBA (Direct Bonded Aluminum) substrate may be used in place of a DBC substrate. The support substrate 20 is at least partially covered by the sealing resin 7 (not shown). The support substrate 20 includes an insulating substrate 26, an obverse-face metal layer 27, and a reverse-face metal layer 28.

The insulating substrate 26 is electrically insulating. The component material of the insulating substrate 26 is ceramics, similarly to the insulating substrate 21. Note that the insulating substrate 26 may alternatively be an insulating resin sheet or the like. The insulating substrate 26 is covered by the sealing resin 7. The insulating substrate 26 has an obverse face 26a and a reverse face 26b that are spaced apart from each other in the thickness direction z and face toward opposite sides.

The obverse-face metal layer 27 is formed so as to partially cover the obverse face 26a. The component material of the obverse-face metal layer 27 is copper. Note that if the support substrate 20 is a DBA substrate, the component material the obverse-face metal layer 27 is aluminum. The obverse-face metal layer 27 is covered by the sealing resin 7. The obverse-face metal layer 27 is patterned, and includes a plurality of pattern electrodes 271 to 275 that are spaced apart from each other. The patterning is performed by means of etching, for example.

The plurality of semiconductor elements 10A are conductively bonded to the pattern electrode 271 via the element bonding layers 31A. The pattern electrode 271 is electrically connected to the reverse-face electrodes 12 (drain electrodes) of the semiconductor elements 10A. A P-terminal (which corresponds to the input terminal 41; not shown) is connected to the pattern electrode 271, and this P-terminal is partially exposed from the sealing resin 7.

The plurality of semiconductor elements 10B are conductively bonded to the pattern electrode 272 via the element bonding layers 31B, and the lead members 51 (second bonding portions 512) are bonded to the pattern electrode 272. The pattern electrode 272 is electrically connected to the first electrodes 111 (source electrodes) of the obverse-face electrodes 11 of the semiconductor elements 10A. The pattern electrode 272 is also electrically connected to the reverse-face electrodes 12 (drain electrodes) of the semiconductor elements 10B. An output terminal (which corresponds to the output terminal 43; not shown) is connected to the pattern electrode 272, and this output terminal is partially exposed from the sealing resin 7.

The lead members 53 (second bonding portions 532) are bonded to the pattern electrode 273. The pattern electrode 273 is electrically connected to the first electrodes 111 (source electrodes) of the obverse-face electrodes 11 of the semiconductor elements 10B. An N-terminal (which corresponds to the input terminal 42; not shown) is connected to the pattern electrode 273, and this N-terminal is partially exposed from the sealing resin 7.

The pair of pattern electrodes 274 are electrically connected to the second electrodes 112 (gate electrodes) of the obverse-face electrodes 11 of the semiconductor elements 10A and 10B via wires (not shown). Gate terminals (which correspond to the gate terminals 44A and 44B; not shown) are connected to the pair of pattern electrodes 274, and these gate terminals are partially exposed from the sealing resin 7.

The pair of pattern electrodes 275 are electrically connected to the first electrodes 111 (source electrodes) of the obverse-face electrodes 11 of the semiconductor elements 10A and 10B via wires (not shown). Detection terminals (which correspond to the detection terminals 45A and 45B; not shown) are connected to the pair of pattern electrodes 275, and these detection terminals are partially exposed from the sealing resin 7.

The reverse-face metal layer 28 is formed so as to at least partially cover the reverse face 26b. The component material of the reverse-face metal layer 28 is copper. Note that if the support substrate 20 is a DBA substrate, the component material of the reverse-face metal layer 28 is aluminum. The reverse-face metal layer 28 may be covered by the sealing resin 7, of a face of the reverse-face metal layer 28 that faces in the thickness direction z1 may be exposed from the sealing resin 7.

In the present embodiment, the lead members 51 and the lead members 53 have the same configuration.

According to the semiconductor device A4, the lead members 51 each of which has the protrusions 521 are provided, similarly to the semiconductor device A1. Accordingly, the semiconductor device A4 can suppress deformation of each lead member 51, similarly to the semiconductor device A1 of the first embodiment. Note that other elements of the semiconductor device A4 that have the same configuration as those of the semiconductor device A1 can exhibit the same advantages as those of the semiconductor device A1.

Figure 29:
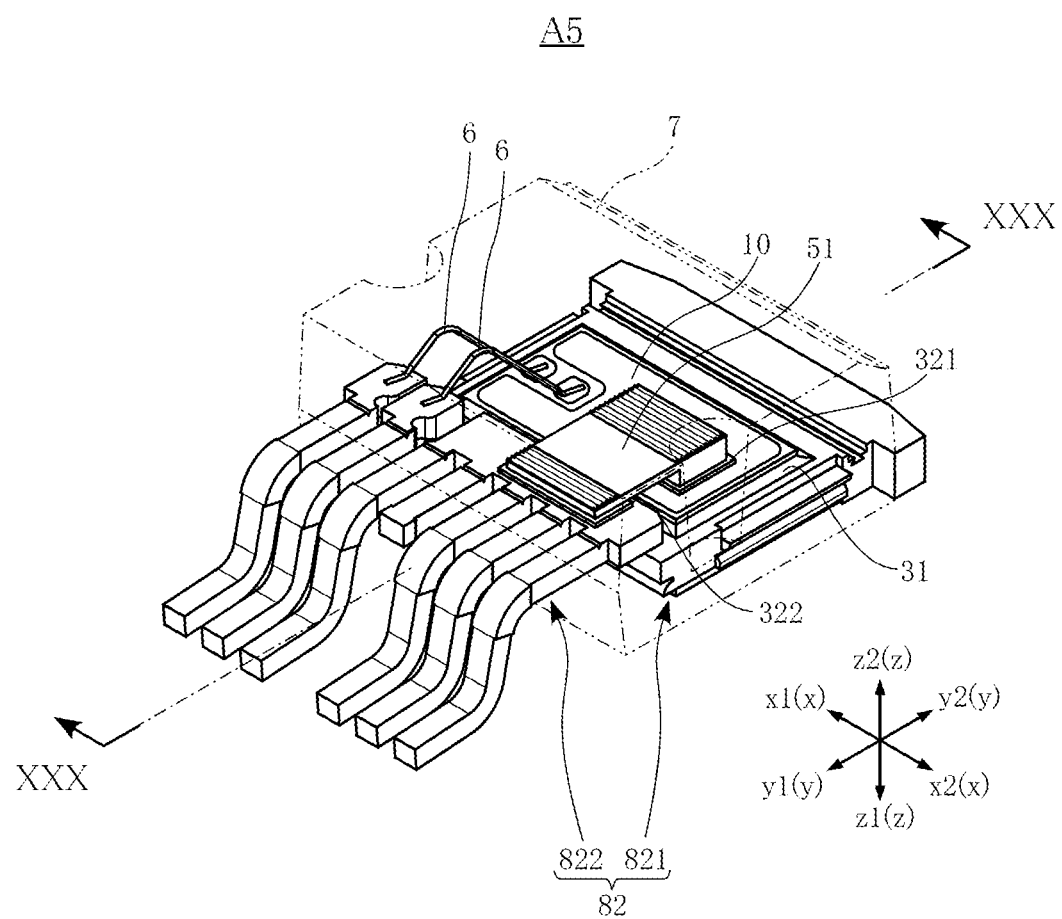
FIG. 29 is a perspective view showing a semiconductor device according to a fifth embodiment.
Figure 30:
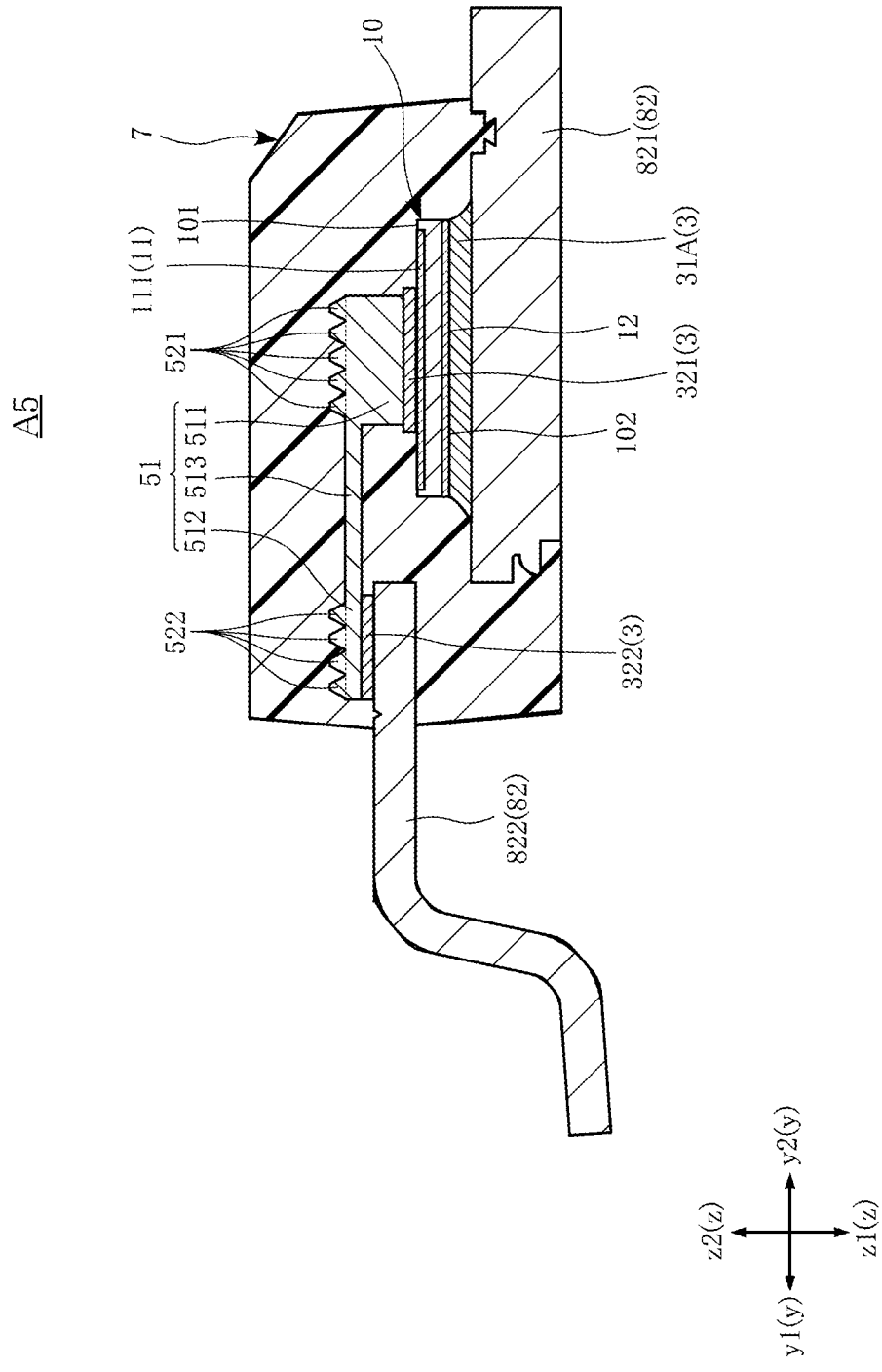
FIG. 30 is a cross-sectional view of FIG. 29 taken along a line XXX-XXX.

FIGS. 29 and 30 show a semiconductor device according to the fifth embodiment. The semiconductor device A5 of the fifth embodiment differs from the first to fourth embodiments in that the semiconductor device A5 is a discrete semiconductor that includes one semiconductor element 10. Note that the semiconductor element is not limited to the semiconductor element 10, and need only be any of various semiconductor elements such as a diode and an IC. FIG. 29 is a perspective view showing the semiconductor device A5, where the sealing resin 7 is indicated by an imaginary line (dash-double dot line). FIG. 30 is a cross-sectional view of FIG. 29 taken along a line XXX-XXX.

The semiconductor device A5 is a so-called lead frame structure, and includes a lead frame 82 as shown in FIG. 29. The component material of the lead frame 82 is not specifically limited, but is Cu or a Cu alloy, for example. The lead frame 82 includes a die pad portion 821 and a terminal portion 822.

The die pad portion 821 is a portion on which the semiconductor element 10 is mounted. In the present embodiment, one semiconductor element 10 is mounted on the die pad portion 821, and the semiconductor element 10 is bonded to the die pad portion 821 via the conductive bonding layer 3 (element bonding layer 31). The die pad portion 821 is electrically connected to the reverse-face electrode 12 of the semiconductor element 10. In the present embodiment, the die pad portion 821 corresponds to a "first conductor" of the present disclosure.

The terminal portion 822 is partially exposed from the sealing resin 7. The terminal portion 822 is electrically connected to the obverse-face electrode 11 of the semiconductor element 10 via the lead member 51. In the present embodiment, the terminal portion 822 corresponds to a "second conductor" of the present disclosure.

In the present embodiment, one edge of the lead member 51 is bonded to the obverse-face electrode 11 of the semiconductor element 10 via the lead bonding layer 321, and the other edge is bonded to the terminal portion 822 via the lead bonding layer 322.

According to the semiconductor device A5, the lead member 51 that has the protrusions 521 are provided, similarly to the semiconductor device A1. Accordingly, the semiconductor device A5 can suppress deformation of the lead member 51, similarly to the semiconductor device A1 of the first embodiment. Note that other elements of the semiconductor device A5 that have the same configuration as those of the semiconductor device A1 can exhibit the same advantages as those of the semiconductor device A1.

Figure 31:
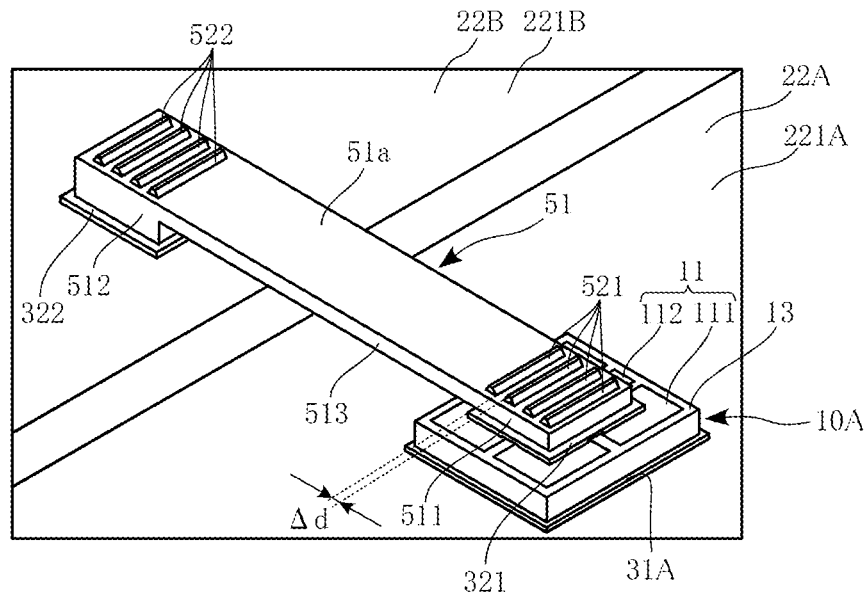
FIG. 31 is an enlarged view of a main part showing protrusions of a lead member according to a variation.
Figure 31:
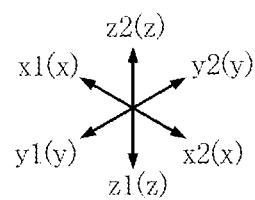

The first to fifth embodiments have described the case where the plurality of protrusions 521 are continuously arranged in the width direction x, but the present invention is not limited thereto. For example, the protrusions 521 may alternatively be evenly spaced apart from each other at a predetermined interval Δd, as shown in FIG. 31. Note that the protrusions 521 need not be arranged at equal intervals. In this case as well, deformation of the lead member 51 can be suppressed by the protrusions 521. Not only the plurality of protrusions 521 but also the plurality of protrusions 522, 541, and 542 may also be similarly modified. Note that FIG. 31 shows the case where, in the semiconductor element 10A, the first electrode 111 of the obverse-face electrode 11 is divided into a plurality of regions by the insulating film 13.

Figure 32:
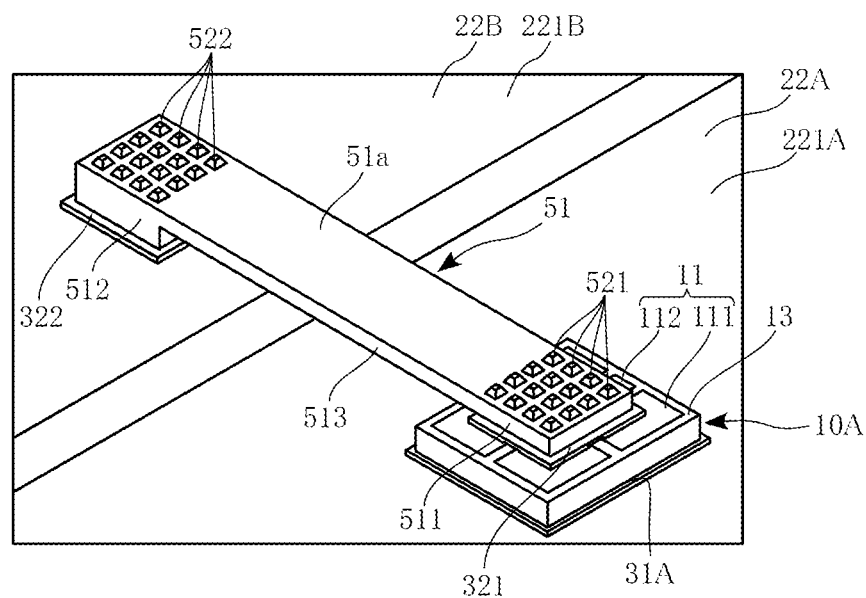
FIG. 32 is an enlarged view of a main part showing protrusions of a lead member according to a variation.
Figure 32:
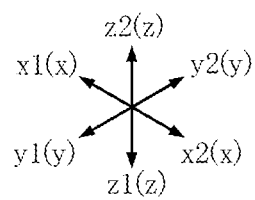

The first to fifth embodiments have described the case where each of the plurality of protrusions 521 has a shape that extends in the depth direction y in a plan view and that is trapezoidal as viewed in the depth direction y, but the present invention is not limited thereto. For example, each of the plurality of protrusions 521 may alternatively have a semicircular shape as viewed in the depth direction y, or may extend in the width direction x in a plan view, or each protrusion 521 may have a pyramidal shape as shown in FIG. 32. In this case as well, deformation of the lead member 51 can be suppressed by the protrusions 521. Not only the plurality of protrusions 521 but also the plurality of protrusions 522, 541, and 542 may also be similarly modified. Note that FIG. 32 shows the case where, in the semiconductor element 10A, the first electrode 111 of the obverse-face electrode 11 is divided into a plurality of regions by the insulating film 13.

Figure 33:
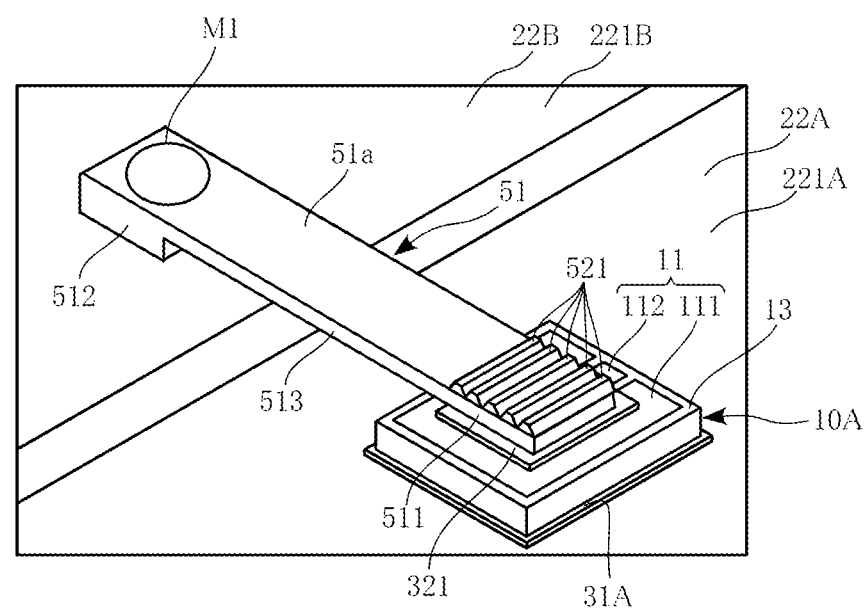
FIG. 33 is an enlarged view of a main part illustrating a method for bonding a lead member according to a variation.

The first to fifth embodiments have described the case where both the first bonding portions 511 and 531 and the second bonding portions 512 and 532 of the lead members 51 and 53 are bonded using the conductive bonding layers 3, but the present invention is not limited thereto. For example, either the first bonding portions 511 and 531 or the second bonding portions 512 and 532 may be bonded by means of laser welding using a laser beam. Note that, considering the influence on the semiconductor element 10, it is preferable that the second bonding portions 512 and 532, which are not bonded to the obverse-face electrode 11 of the semiconductor element 10, are bonded by means of laser welding, rather than the first bonding portions 511 and 531, which are bonded to the obverse-face electrode 11 of the semiconductor element 10. FIG. 33 shows the case where, in the lead member 51 according to the first embodiment, the second bonding portion 512 is bonded by means of laser welding. In this variation, the protrusions 522 are not formed in the second bonding portion 512, and a welding mark Ml, which may be formed as a result of laser welding, is formed as shown in FIG. 33.

The semiconductor device and the method for manufacturing the semiconductor device according to the present disclosure are not limited to the above-described embodiments. The specific configuration of each part of the semiconductor device of the present disclosure and specific treatment in each step of the method for manufacturing the semiconductor device of the present disclosure may be freely designed and changed in various manner.

Clause 1.
A semiconductor device comprising:
a semiconductor element having an element obverse face and an element reverse face that face toward mutually opposite sides in a first direction, the semiconductor element being formed with an obverse-face electrode and a reverse-face electrode on the element obverse face and the element reverse face, respectively;
a first conductor opposing the element reverse face and conductively bonded to the reverse-face electrode;
a second conductor spaced apart from the first conductor and electrically connected to the obverse-face electrode; and
a connecting member having a connecting member obverse face facing in a same direction as the element obverse face, the connecting member connecting the obverse-face electrode and the second conductor to each other,
wherein the connecting member includes a first protrusion protruding in the first direction from the connecting member obverse face, and is bonded to the obverse-face electrode via a first bonding layer, and
the first protrusion overlaps with the obverse-face electrode as viewed in the first direction.

Clause 2.
The semiconductor device according to claim 1, wherein the first protrusion extends in a second direction orthogonal to the first direction, as viewed in the first direction.

Clause 3.
The semiconductor device according to claim 2, wherein the first protrusion includes a pair of first side faces rising from the connecting member obverse face, and
the pair of first side faces are mutually spaced apart in a third direction orthogonal to the first direction and the second direction.

Clause 4.
The semiconductor device according to claim 3, wherein the pair of first side faces are inclined with respect to the connecting member obverse face.

Clause 5.
The semiconductor device according to claim 4, wherein an angle formed by the pair of first side faces is in a range from 60° to 120°.

Clause 6.
The semiconductor device according to any one of claims 3 to 5, wherein the first protrusion further includes a first top face connected to the pair of first side faces.

Clause 7.
The semiconductor device according to claim 6, wherein the first top face is flat.

Clause 8.
The semiconductor device according to claim 7, wherein the first top face is inclined with respect to the connecting member obverse face.

Clause 9.
The semiconductor device according to any one of claims 1 to 8, further comprising a second bonding layer disposed between the connecting member and the second conductor for electrically connecting the connecting member and the second conductor to each other.

Clause 10.
The semiconductor device according to claim 9, wherein the connecting member includes at least one second protrusion protruding in the first direction from the connecting member obverse face, and
each of the at least one second protrusion overlaps with the second bonding layer as viewed in the first direction.

Clause 11.
The semiconductor device according to claim 10, wherein the second protrusion extends in a second direction orthogonal to the first direction, as viewed in the first direction.

Clause 12.
The semiconductor device according to claim 11, wherein the second protrusion includes a pair of second side faces rising from the connecting member obverse face, and
the pair of second side faces are mutually spaced apart in a third direction orthogonal to the first direction and the second direction.

Clause 13.
The semiconductor device according to claim 12, wherein the pair of second side faces are inclined with respect to the connecting member obverse face.

Clause 14.
The semiconductor device according to claim 13, wherein an angle formed by the pair of second side faces is in a range from 60° to 120°.

Clause 15.
The semiconductor device according to any one of claims 12 to 14, wherein the second protrusion further includes a second top face connected to the pair of second side faces.

Clause 16.
The semiconductor device according to any one of claims 1 to 15, wherein the connecting member includes a first bonding portion bonded to the semiconductor element and a second bonding portion bonded to the second conductor, and
the second bonding portion is greater in length in the first direction than the first bonding portion.

Clause 17.
The semiconductor device according to claim 16, wherein the connecting member further includes a connecting portion connecting the first bonding portion and the second bonding portion to each other, and
the connecting member obverse face is formed by surfaces of the first bonding portion, the second bonding portion, and the connecting portion, the surfaces facing toward one side in the first direction.

Clause 18.

The semiconductor device according to claim 17, wherein the connecting portion overlaps with the first bonding portion in a third direction orthogonal to the first direction.

Clause 19.

The semiconductor device according to any one of claims 1 to 18, wherein the semiconductor element is conductively bonded to the first conductor via a third bonding layer.

Clause 20.

The semiconductor device according to any one of claims 1 to 19, wherein the semiconductor element is a power MOSFET.

Clause 21.

The semiconductor device according to any one of claims 1 to 20, wherein the first bonding layer comprises a sintered metal.

Clause 22.

The semiconductor device according to any one of claims 1 to 21, further comprising a sealing resin covering the semiconductor element, the connecting member, the first bonding layer, at least a portion of the first conductor, and at least a portion of the second conductor.

Clause 23.

A method for manufacturing a semiconductor device, the semiconductor device comprising:

a semiconductor element having an element obverse face and an element reverse face that face toward mutually opposite sides in a first direction;

a first conductor and a second conductor arranged spaced apart from each other, and a connecting member having a connecting member obverse face facing toward one side in the first direction and including a first protrusion protruding in the first direction from the connecting member obverse face, the method comprising:

a connecting member preparation step of preparing the connecting member;

a mounting step of mounting the semiconductor element to the first conductor;

a sintering metallic material forming step of forming a sintering metallic material on the element obverse face;

a connecting step of placing a portion of the connecting member on the sintering metallic material such that the connecting member obverse face is in an orientation facing in a same direction as the element obverse face and such that the sintering metallic material and the first protrusion overlap with each other as viewed in the first direction; and a pressure heating step of pressing, using a pressing member, the connecting member from a side on which the first protrusion is formed, and heating the sintering metallic material into a sintered metal.

The invention claimed is:

1. A semiconductor device comprising:
a semiconductor element having an element obverse face and an element reverse face that face toward mutually opposite sides in a first direction, the semiconductor element being formed with an obverse-face electrode and a reverse-face electrode on the element obverse face and the element reverse face, respectively;
a first conductor opposing the element reverse face and conductively bonded to the reverse-face electrode;
a second conductor spaced apart from the first conductor and electrically connected to the obverse-face electrode;
an insulating substrate, the first and second conductors being arranged on the insulating substrate; and
a connecting member having a connecting member obverse face facing in a same direction as the element obverse face, the connecting member connecting the obverse-face electrode and the second conductor to each other,
wherein the connecting member includes a first protrusion protruding in the first direction from the connecting member obverse face, and is bonded to the obverse-face electrode via a first bonding layer,
the first protrusion overlaps with the obverse-face electrode as viewed in the first direction, and
the first bonding layer comprises a sintered metal.

2. The semiconductor device according to claim 1, wherein the first protrusion extends in a second direction orthogonal to the first direction, as viewed in the first direction.

3. The semiconductor device according to claim 2, wherein the first protrusion includes a pair of first side faces rising from the connecting member obverse face, and
the pair of first side faces are mutually spaced apart in a third direction orthogonal to the first direction and the second direction.

4. The semiconductor device according to claim 3, wherein the pair of first side faces are inclined with respect to the connecting member obverse face.

5. The semiconductor device according to claim 4, wherein an angle formed by the pair of first side faces is in a range from 60° to 120°.

6. The semiconductor device according to claim 3, wherein the first protrusion further includes a first top face connected to the pair of first side faces.

7. The semiconductor device according to claim 6, wherein the first top face is flat.

8. The semiconductor device according to claim 7, wherein the first top face is inclined with respect to the connecting member obverse face.

9. The semiconductor device according to claim 1, further comprising a second bonding layer disposed between the connecting member and the second conductor for electrically connecting the connecting member and the second conductor to each other.

10. The semiconductor device according to claim 9, wherein the connecting member includes at least one second protrusion protruding in the first direction from the connecting member obverse face, and
each of the at least one second protrusion overlaps with the second bonding layer as viewed in the first direction.

11. The semiconductor device according to claim 10, wherein the second protrusion extends in a second direction orthogonal to the first direction, as viewed in the first direction.

12. The semiconductor device according to claim 11, wherein the second protrusion includes a pair of second side faces rising from the connecting member obverse face, and
the pair of second side faces are mutually spaced apart in a third direction orthogonal to the first direction and the second direction.

13. The semiconductor device according to claim 12, wherein the pair of second side faces are inclined with respect to the connecting member obverse face.

14. The semiconductor device according to claim 13, wherein an angle formed by the pair of second side faces is in a range from 60° to 120°.

15. The semiconductor device according to claim 12, wherein the second protrusion further includes a second top face connected to the pair of second side faces.

16. The semiconductor device according to claim 1, wherein the connecting member includes a first bonding portion bonded to the semiconductor element and a second bonding portion bonded to the second conductor, and
  the second bonding portion is greater in length in the first direction than the first bonding portion.

17. The semiconductor device according to claim 16, wherein the connecting member further includes a connecting portion connecting the first bonding portion and the second bonding portion to each other, and
  the connecting member obverse face is formed by surfaces of the first bonding portion, the second bonding portion, and the connecting portion, the surfaces facing toward one side in the first direction.

18. The semiconductor device according to claim 17, wherein the connecting portion overlaps with the first bonding portion in a third direction orthogonal to the first direction.

19. The semiconductor device according to claim 1, wherein the semiconductor element is conductively bonded to the first conductor via a third bonding layer.

20. The semiconductor device according to claim 1, wherein the semiconductor element is a power MOSFET.

21. The semiconductor device according to claim 1, further comprising a sealing resin covering the semiconductor element, the connecting member, the first bonding layer, at least a portion of the first conductor, and at least a portion of the second conductor.

22. The semiconductor device according to claim 1, wherein the semiconductor element is made of a semiconductor material mainly composed of SiC.

23. The semiconductor device according to claim 1, wherein the sintered metal is formed by drying and sintering silver paste.

* * * * *